(12) United States Patent
Yang et al.

(10) Patent No.: US 7,262,917 B2
(45) Date of Patent: Aug. 28, 2007

(54) OUT-OF-PLANE PRE-ALIGNED REFRACTIVE MICRO LENS

(75) Inventors: Ren Yang, Baton Rouge, LA (US); Wanjun Wang, Baton Rouge, LA (US)

(73) Assignee: Board of Supervisors of Louisiana State University and Agricultural and Mechanical College, Baton Rouge, LA (US)

( * ) Notice: Subject to any disclaimer, the term of this patent is extended or adjusted under 35 U.S.C. 154(b) by 0 days.

(21) Appl. No.: 11/056,910

(22) Filed: Feb. 11, 2005

(65) Prior Publication Data

US 2005/0207018 A1    Sep. 22, 2005

Related U.S. Application Data

(60) Provisional application No. 60/600,892, filed on Aug. 12, 2004, provisional application No. 60/547,854, filed on Feb. 26, 2004, provisional application No. 60/544,413, filed on Feb. 13, 2004.

(51) Int. Cl.
G02B 27/10 (2006.01)
(52) U.S. Cl. .............. 359/619; 359/622; 359/623; 359/620
(58) Field of Classification Search ........... 359/622, 359/619, 620, 623, 627, 811, 813, 819, 822; 378/34, 35
See application file for complete search history.

(56) References Cited

U.S. PATENT DOCUMENTS

2004/0027675 A1*   2/2004   Wu et al. .............. 359/619

OTHER PUBLICATIONS

Cox, J. A. et al., "Optical Performance of High-Aspect LIGA Gratings II," *Optical Engineering*, vol. 37(11), pp. 2878-2884 (1998).

Hossfeld, J. et al., "Polymeric Optical MEMS," *Proceedings of SPIE—The International Society for Optical Engineering*, vol. 3680, No. II, pp. 637-645 (1999).

Ishii, Y. et al., "Hybrid Integration of Polymer Microlens With VCSEL Using Drop-on-Demand Technique," *Proceedings of SPIE—The International Society for Optical Engineering*, vol. 3952, pp. 364-374 (2000).

King, C. et al., "Out-of-Plane Refractive Microlens Fabricated by Surface Micromachining," *IEEE Photonics Technology Letters*, vol. 8, No. 10, pp. 1349-1351 (1996).

(Continued)

*Primary Examiner*—Brandi N. Thomas
(74) *Attorney, Agent, or Firm*—Bonnie J. Davis; John H. Runnels

(57) ABSTRACT

An inexpensive device and method of fabricating microlenses able to be pre-aligned with other optical components (e.g., mirrors, splitters, and prisms, cylindrical lenses, planoplates and prisms) fabricated on the same substrate to form an integrated optical platform. This integrated optical platform enhances optical systems by reducing coupling losses, cross-talking, and dispersion, and allowing for the simultaneous optical focusing of one or more light beams in a true, three-dimensional arrangement. The novel device comprises an optical lens having an out-of-plane orientated, optical axis (i.e., the optical axial is parallel to the substrate on which the optical bench system is located) with a quasi-parabolic surface.

9 Claims, 20 Drawing Sheets

OTHER PUBLICATIONS

Lee, S. et al., "A Simple Method for Microlens Fabrication by the Modified LIGA Process," *Journal of Micromechanics and Microengineering*, vol. 12, pp. 334-340 (2002).

Mohr, J. et al., "Micro-Optical and Opto-Mechanical Systems Fabricated by the LIGA Technique," *Proceedings of SPIE—The International Society for Optical Engineering*, vol. 3008, pp. 273-278 (1997).

Wu, M. et al., "Free-Space Integrated Optics Realized by Surface-Micromachining," *International Journal of High Speed Electronics and Systems*, vol. 8, No. 2, pp. 51-65 (1997).

Wu, M., "Micromachining for Optical and Optoelectronic Systems," *Proceeding of the IEEE*, vol. 85, No. 11, pp. 1833-1856 (1997).

Yang, R. et al., "Fabrication of Out-of-Plane Refractive Concave and Convex Microlens Arrays," Proceedings of the SPIE, vol. 5717, pp. 134-141 (2004).

Yang, R. et al., "Fabrication of Out-of-Plane SU-8 Refractive Microlens Using Directly Lithography Method," *Proceedings of SPIE—The International Society for Optical Engineering*, vol. 5346, pp. 151-159 (2004).

Yang, R. et al., "Microfabrication of an Integrated SU-8 Waveguide with an Imbedded Focusing Lens for Application in Single Molecule Detection (SMD)," *Proceedings of the SPIE*, vol. 5718, pp. 54-59 (2005).

Yang, R. et al., "Numerical and Experimental Study of an Out-of-Plane Prealigned Refractive Microlens Fabricated Using Ultraviolet Lithography Method," *Optical Engineering*, vol. 43, No. 12, pp. 3096-3103 (2004).

Yang, R. et al., "Out-of-plane Microlens Array Fabricated Using Ultraviolet Llithography," *Applied Physics Letters*, vol. 86, pp. 161110-1-3 (2005).

Yang, R. et al., "Out-of-plane Polymer Refractive Microlens Fabricated Based on Direct Lithography of SU-8," *Sensors and Actuators A: Physical*, vol. 113, No. 1, pp. 71-77 (2004).

Yi, Y. et al., "Assembly of Micro-Optical Devices Using Magnetic Actuation," *Sensors and Actuators* vol. 78, pp. 205-211 (1999).

\* cited by examiner

OUT-OF-PLANE PRE-ALIGNED REFRACTIVE MICRO LENS

This invention pertains to a device and method of microfabricating optical devices, particularly micro-optical lenses (e.g., ball lenses, spherical lenses, and aspheric lenses), which can be pre-aligned with other optical components (e.g., mirrors, splitters, cylindrical lenses, plano-plates, and prisms) fabricated on the same substrate to form an integrated optical platform.

In the last few years, research has been very active on low-cost production, microfabrication techniques for manufacturing micro-optical systems/benches for use in military technology, telecommunications, metrology, and biochemistry applications to reduce the size, weight, assembly, adjust time, and fabrication processes of optical systems. Various types of micro-optical systems have been developed in the last few years such as integrated, free-space micro-optical systems/benches. Microlenses are an important component of integrated micro-optical systems.

There are several methods used to fabricate microlenses. One method involves using lithography to create photoresist cylinders, and then converting the cylinders to a liquid state, which allows the surface tension of the cylinders to form an aspheric surface. The aspheric surfaces are then cooled to room temperature to form microlenses. See S. Lee et al., "A Simple Method for Microlens Fabrication by the Modified LIGA Process," *Journal of Micromechanics and Microengineering*, Vol. 12, No. 3, pp. 334-340 (2002).

Another method for fabricating microlenses involves injecting droplets of an ultraviolet-curable epoxy onto a flat surface, and then exposing the epoxy to create plano-convex microlenses. See I. Yuzo et al., "Hybrid Integration of Polymer Microlens With VCSEL Using Drop-on-Demand Technique," *Proceedings of SPIE—The International Society for Optical Engineering*, Vol. 3952, pp. 364-374 (2000).

Microlenses fabricated with conventional lithography processes are usually created in the same plane as the support substrate in which the lenses are attached because the patterning-mask and support substrate are perpendicular to a UV-light source. However, to develop integrated, out-of-plane optical systems, the optical axial should be parallel to the support substrate on which the optical system is located. Until recently, the main method of obtaining such lenses was to use a lean device having a flexible hinge able to suspend the microlens, and allow for the lens to be reoriented in a vertical position either electrostatically or electromagnetically. See C. King et al., "Out-of-Plane Refractive Microlens Fabricated by Surface Micromachining," *IEEE Photonics Technology Letters*, Vol. 8, No. 10, pp 1349-1351 (1996); M. Wu, "Micromachining for Optical and Optoelectronic Systems," *Proceeding of IEEE*, Vol. 85, No. 11, pp. 1833-1856 (1997); M. Wu et al., "Free-Space Integrated Optics Realized by Surface Micromaching," *International Journal of High Speed Electronics and Systems*, Vol. 8, No. 2, pp. 51-65 (1997); and W. Yong et al., "Assembly of Micro Optical Components Using Magnetic Actuation," *Sensors and Actuators A*, Vol. 78, pp. 205-211 (1999).

X-ray lithography-based LIGA technology has also been used to create micro-optical components and devices. ("LIGA" is a German acronym for "lithography, electrodeposition, and molding.") The LIGA process, based on deep X-ray lithography and electrodeposition, is a well-known technique that makes it possible to create high aspect ratio microstructures having high aspect ratios of up to approximately 100:1. While conventional LIGA, in many instances, is a preferred method of fabricating microstructures, it requires access to a synchrotron radiation source, which is generally undesirable in mass reproduction due to costs associated with building and maintaining a synchrotron radiation facility.

As an economical alternative, UV-LIGA fabrication technology based on UV-lithography of SU-8 (MicroChem Inc., Newton, Mass.) has attracted a lot of attention in recent years. SU-8 is a negative photoresist, commonly used in microelectromechanical systems (MEMS). Cross-linked SU-8 is well known for its desirable chemical and physical properties and can serve as excellent structural material for many applications. It has relatively high thermal stability with the glass temperature at higher than 200 degree centigrade and very good optical properties. Worldwide research efforts have lead to some significant breakthroughs recently, making it more feasible to use conventional UV-lithography of SU-8 for optical applications having planar or cylindrical surfaces. See J. Gottert et al., "Micro-optical and Opto-Mechanical Systems Fabricated by the LIGA Technique," *Proceedings of SPIE—The International Society for Optical Engineering*, Vol. 3008, pp. 273-278 (1997); A. Cox et al., "Optical Performance of High-Aspect LIGA Grating II," *Optical Engineering*, Vol. 37(11), pp. 2878-2884 (1998); and J. Hossfeld et al., "Polymeric Optical MEMS," *Proceedings of SPIE—The International Society for Optical Engineering*, Vol. 3680, No. II, pp. 637-645 (1999).

An unfilled need exists for a device and method of microfabricating optical devices, particularly micro-optical lenses (e.g., ball lenses, spherical lenses, and aspheric lenses), which can be pre-aligned with other optical components (e.g. mirrors. splitters. cylindrical lenses, plano-plates, and prisms) fabricated on a single substrate to form an integrated optical platform.

We have discovered a novel device and method of microfabricating polymeric optical devices, particularly micro-optical lenses (e.g., ball lenses, spherical lenses, and aspheric lenses), which can be pre-aligned with other optical components (e.g., mirrors, splitters, prisms, cylindrical lenses, and piano-plates) fabricated on the same substrate to form an integrated optical platform. This integrated optical platform enhances optical systems by reducing coupling losses (i.e., energy losses that occur when energy is transferred from one circuit, circuit element, or medium to another), cross-talking (i.e., a disturbance caused by the optical signal of one optical path affecting another optical signal in an adjacent optical path), and dispersion, and allowing for the simultaneous optical focusing of one or more light beams in a true, three-dimensional arrangement. The device can be used to build free-space optical platforms and optical chips to carry out optical focusing functions. The novel device comprises an optical lens having an out-of-plane orientated, optical axis (i.e., the optical axial is parallel to the substrate on which the optical bench system is located) with a quasi-parabolic surface. In a preferred embodiment, an array of microlenses is fabricated on a single support substrate (e.g., glass or silicon substrate) with the optical axis in a position parallel to the support substrate, using lithography of SU-8. This fabrication process also allows for the fabrication of arrays of out-of-plane microlenses having multi-parallel optical channels.

Unlike other optical fabrication techniques, lithography allows for the integration of microlenses into other optical components (e.g., telecommunications systems and chip-to-chip optical connections) in a free-space, integrated micro-optical without requiring any assembly or alignment adjustments by fabricating a mask for use in creating microlenses and other optical components, which are pre-aligned with each other in the micro-optical bench. This is achieved by incorporating into the mask design all of the optical components of the optical bench in which the microlens will be used. Typical dimensions of out-of-plane micro-optical lenses made from SU-8 range from a lens having a square aperture with dimensions of 20 µm by 20 µm and a height of about $20\sqrt{2}$ µm to a lens having a square aperture with dimensions of 707 µm by 707 µm and a height of about 1000 µm.

Figure 1:
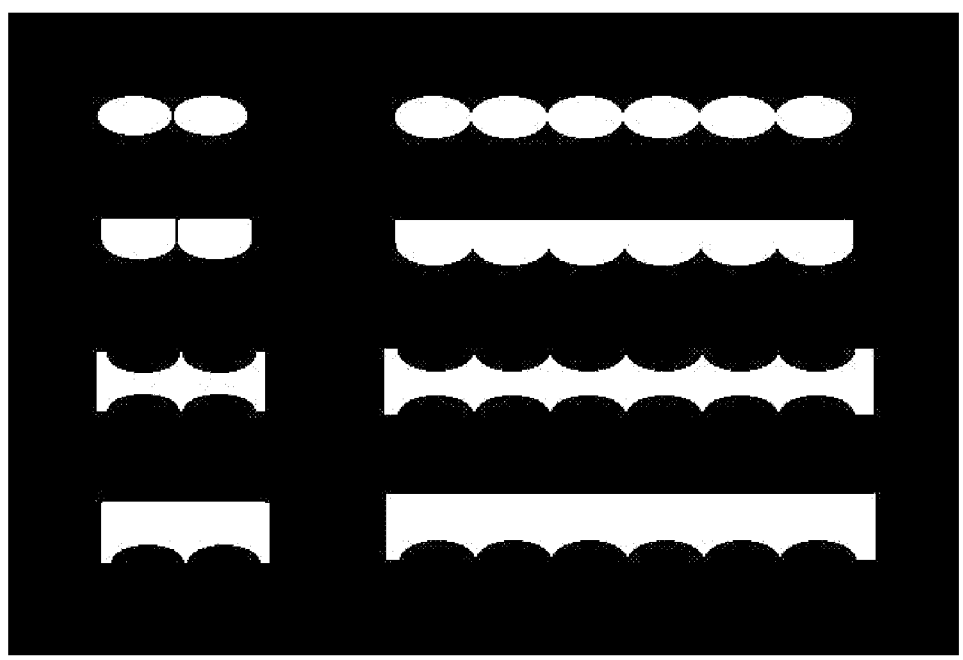
FIG. 1 illustrates a top plan view of a mask used to fabricate one embodiment of an array of micro-lenses.

A general purpose of this invention is to provide an apparatus and inexpensive method for rapid production of micro-optical lenses (e.g., ball lenses, spherical lenses, and aspheric lenses), which can be pre-aligned with other optical components (e.g., mirrors, splitters, and prisms, cylindrical lenses, plano-plates and prisms) fabricated on the same substrate to form an integrated optical platform. This integrated optical platform helps reduce coupling losses (energy losses), cross-talking, and dispersion, and allows for the optical focusing of one or more light beams in a true, three-dimensional arrangement to enhance optical systems. More specifically, a purpose of this invention is to provide an inexpensive method for rapid fabrication of micro-optical lenses suitable for three-dimensional, optical focusing functions, and able to be integrated into other optical components (e.g., telecommunications systems and chip-to-chip optical connections) in a free-space micro-optical bench (i.e., a support surface for optical components, which allows for the precise longitudinal positioning of one optical component relative to another) without any assembly or alignment adjustments after the fabrication process. This is achieved by fabricating a mask for use in creating the microlens, which is pre-aligned with other optical components on a particular optical bench by incorporating into its design all of the optical components of the optical bench in which the microlens will be used.

A preferred micro-optical lens patterning material is SU-8 (MicroChem Corporation, Newton, Mass.). (Other patterning materials such as photosensitive hybrid sol-gel glass may be used to fabricate microlenses in accordance with this invention.) SU-8 is preferred because it is suitable for fabricating microlenses having dimensions SU-8 is suitable for fabricating microlenses having dimensions ranging from a lens having a square aperture with dimensions of 20 µm by 20 µm and a height of about $20\sqrt{2}$ µm to a lens having a square aperture with dimensions of 707 µm by 707 µm and a height of about 1000 µm, and it has superior chemical and mechanical properties in addition to its ease of fabrication using X-ray or UV-based LIGA. SU-8 has a high glass transition temperature range (between about 150° C. and about 220° C.), a high shear modulus (between about 6.26

MPa and about 7.49 MPa), and Young's modulus from 2396-2605 MPa at R.T. and 653-1017 MPa at 150° C. It is also bio-compatible and can be treated with other types of bio-materials such as parylene. It also has a low loss tangent (tan δ<<0.001).

There are several advantages to microfabricating this device using lithography for thick films of SU-8 resist or photosensitive glass. The number of components can be minimal. Fabrication can be simple and inexpensive. The novel design allows for the convenient application of polymer as a structural material and can easily be integrated into other optical components for use in free-space micro-optical systems without requiring any manual adjustments or additional assemblies. The novel design is three-dimensional, unlike most prior microlenses, which are essentially two-dimensional in design.

EXAMPLE 1

Construction of a Mask for use in Fabricating Quasi Spherical-Shaped Microlenses FIG. 1 shows a top plan view of a mask used to fabricate one embodiment of the microlens in accordance with this invention. The mask was created using commercially available optical masks manufactured by Nanofilm, Inc. (Westlake Village, Calif.). The mask was constructed from a 1 μm thick layer of coated, positive photoresist and an approximately 1 μm thick layer of chrome applied to a piece of soda lime glass or quartz. One portion of the mask included two elliptical-shaped openings, which were used to fabricate a single microlens, while another portion of the mask included a multitude (e.g., for, six, eight, ten, twelve, and fourteen) of elliptical-shaped openings to fabricate an array of microlenses. (When fabricating an array of microlenses, the number of openings should exceed the number of pixels in the array by one.) The elliptical-shaped openings were printed onto the mask using a pattern generator, as shown in FIG. 1, to form microlenses. A variety of other conic shapes can be used to produce microlenses such as a hyperbolas, parabolas, prolate ellipses, circles, and oblate ellipses.

The optical mask was then dipped into a 354 or 454 developer solution (Aldrich Chemical Company, Inc., (Aldrich Chemical Company Inc., Milwaukee, Wis.) for approximately 1.0-1.5 min and rinsed in deionized water. Because SU-8 is a negative photoresist, the exposed regions remained, while the unexposed regions were removed after by development process. The optical mask was then dipped into a chrome etching solution (Aldrich Inc., Aldrich Chemical Company Inc., Milwaukee, Wis.) to pattern a Cr layer. Once the etching process was completed, the optical mask was dried using nitrogen.

EXAMPLE 2

Figure 2:
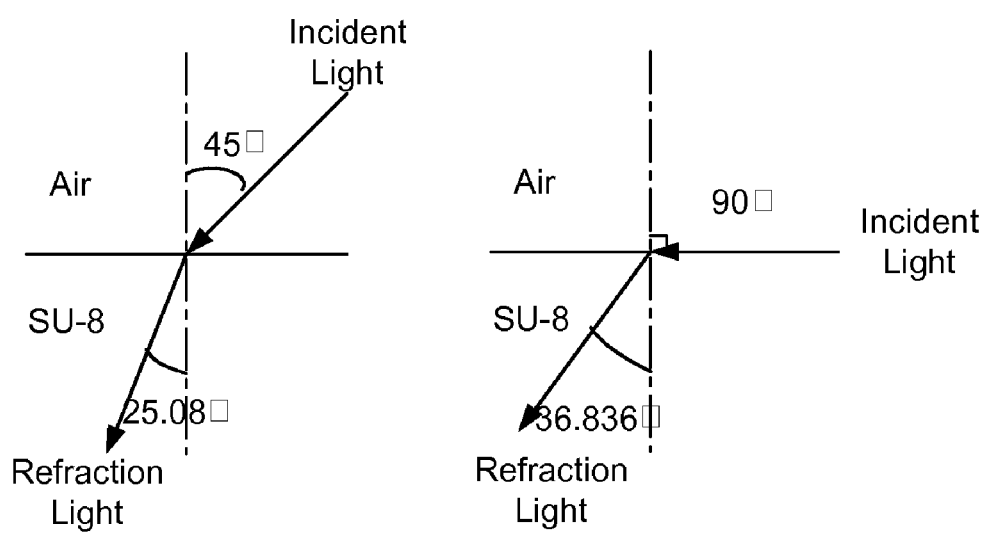
FIG. 2 is a graph plotting the refraction light and critical angles for exposing SU-8 photoresist to UV-light when fabricating one embodiment of an array of micro-lenses using the UV-lithography process.

Compensation for Light Refraction when Fabricating Quasi Spherical-Shaped Lenses to Achieve an Appropriate UV-Light Incident Angle Inside SU-8 Photoresist Light refraction occurs when UV-light is projected onto SU-8 100 photoresist at an angle. To produce cylindrical sections having tilted supporting posts that intersect at an angle of 90 degrees to form one embodiment of the microlens, a right angle coupling prism (NT32-538; Edmund Optics, Barrington, N.J.] and glycerin optical liquid (G7893; Aldrich Chemical Company Inc., Milwaukee, Wis.) were used to compensate for light refraction by projecting the UV-light beams onto the photoresist at an angle of approximately 45 degrees, and obtaining an approximately 25.08-degree angle of UV-light inside the SU-8, based on the refraction index of SU-8 100: n=1.668 at λ=365 nm, and n=1.650 at λ=405 nm, as shown in FIG. 2. (At 365 nm of refraction light, the critical angle of SU-8 is about 36.836 degrees.) From the diagram shown in FIG. 3, in order to achieve a 45-degree angle at which UV-light enters SU-8 photoresist when λ=365 nm, according to Snell's law, $\theta_1$ may be figured from the following equation:

$$n_1 \sin\theta_1 = n_2 \sin\theta_2 = n_3 \sin\theta_3 = n_4 \sin\theta_4 = n_5 \sin\theta_5, \quad (1)$$

$\theta_5$ can be obtained as $$\theta_5 = \sin^{-1}\left(\frac{n_1 \sin \theta_1}{n_5}\right) = \sin^{-1}\left(\frac{1.668 \times \sin 45°}{1.53}\right) = 50.43°. \quad (2)$$

From a geometric relationship, we know $$\theta_6 = \theta_5 - 45° = 50.43 - 45 = 5.43°. \quad (3)$$

From Snell's law, $\theta_7$ can be obtained as follows:

$$\theta_7 = \sin^{-1}\left(\frac{n_6 \sin \theta_6}{n_7}\right) = 8.32°. \quad (4)$$

Figure 3:
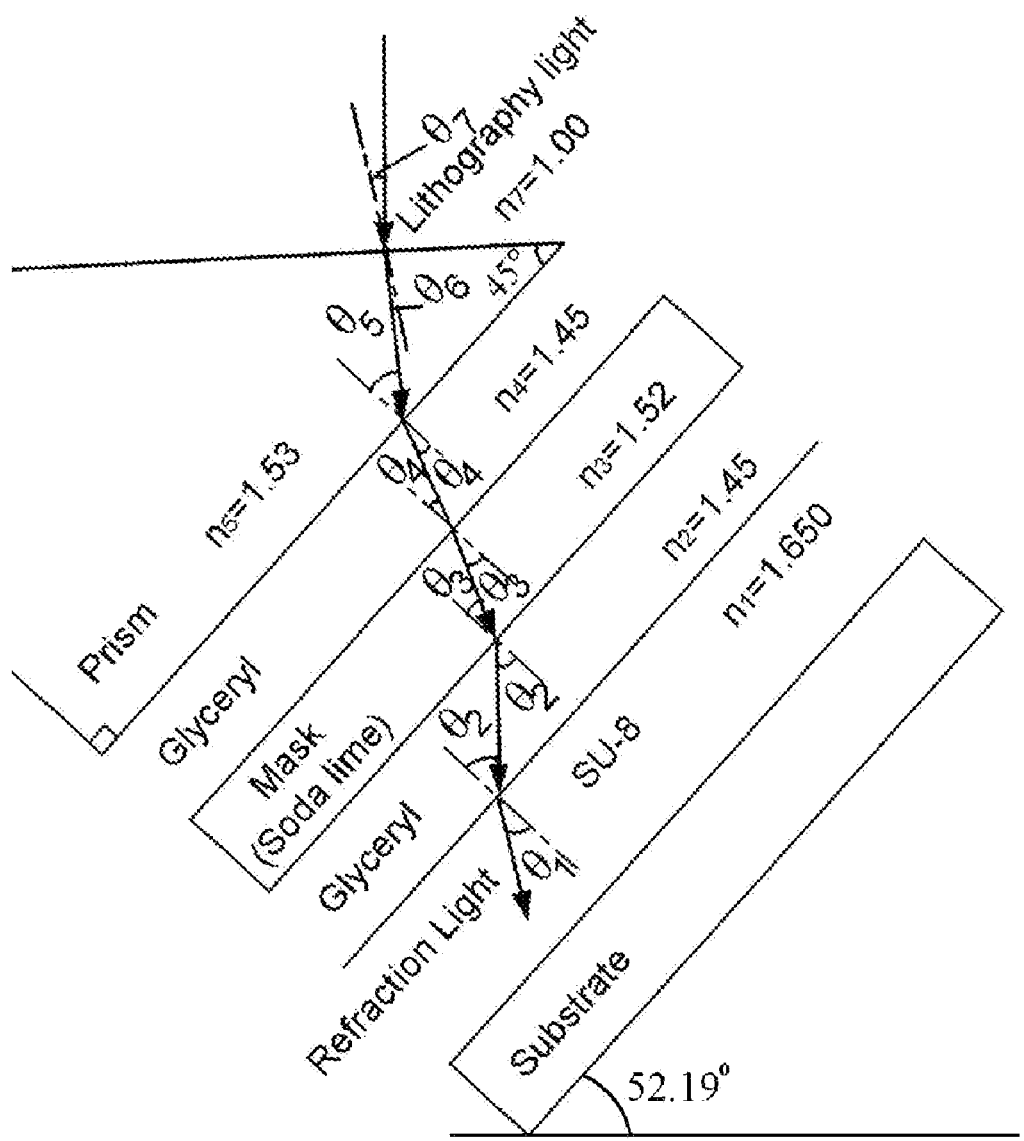
FIG. 3 is a graph plotting the angular position of a support substrate for compensating for light refraction at the interface of UV-light and an SU-8 100 photoresist.

Based on these calculations, the support substrate, as shown in FIG. 3, was positioned 53.19 degrees from the horizontal direction to compensate for light refraction at the interface of the optical mask and SU-8 100 photoresist to obtain a 90-degree intersection. In this embodiment, a mask having elliptical-shaped openings, as explained in Example 1, was used to create cylindrical beams of UV light for fabricating quasi spherical-shaped microlenses. In order to obtain a cylindrical-shaped light beam for an incident light with a 45-degree tilt, the length of the long axis of the elliptical-shaped openings was $\sqrt{2}$ times the length of the short axis of the openings.

EXAMPLE 3

Figure 4A:
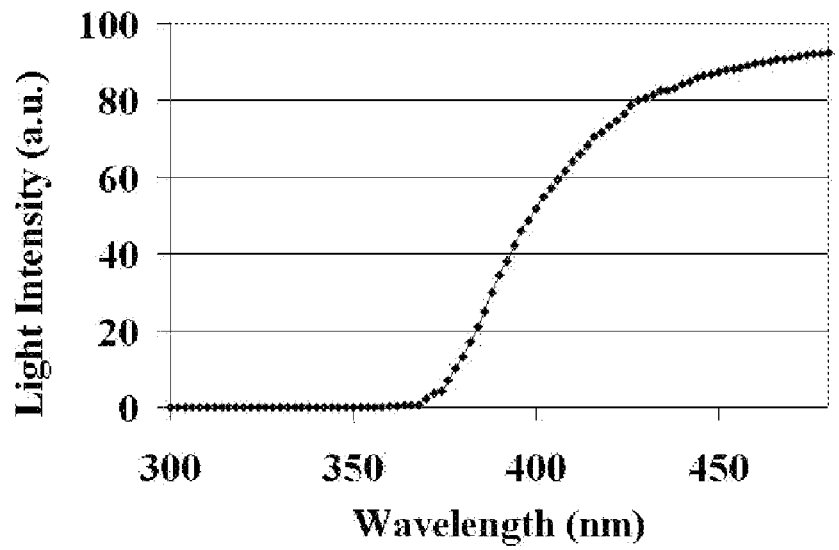
FIG. 4 is a graph plotting the transmission spectrum of a 1 mm thick unexposed layer of SU-8 100 photoresist as a function of wavelength.

Selection of a UV-Light Wavelength to Inhibit the Occurrence of Over-Exposure in the Surface Layer of a Quasi Spherical-Shaped Ball/Spherical Lenses FIG. 4A is a graph plotting the transmission spectrum of a 1 mm thick unexposed layer of SU-8 100 photoresist as a function of wavelength. The absorption coefficient of the SU-8 photoresist at λ=405 nm (the h-line) was about 25 percent that of SU-8 photoresist at λ=365 nm (the i-line), and three times that of SU-8 100 photoresist at λ=436 nm (the g-line). The light components of the shorter wavelengths, as shown in FIG. 4, were primarily absorbed in the surface region of the photoresist, while the longer wavelength components penetrated and exposed the bottom region of the photoresist. To prevent this from occurring, wavelengths shorter than 365 nm were filtered out to inhibit the occurrence of any over-exposure in the surface layer. Longer wavelengths (e.g., the g-line and h-line) with lower absorbance levels were used to allow more energy to reach the bottom portion of the SU-8 100 photoresist layer and to achieve uniform absorbency. through a 4.538 mm thick polymethyl methacrylate (PMMA) sheet.

Figure 4B:
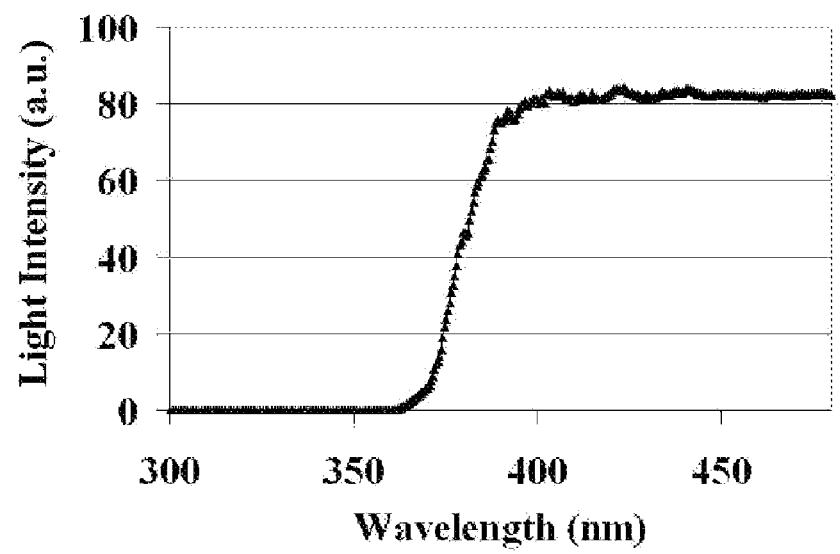
Figure 4C:
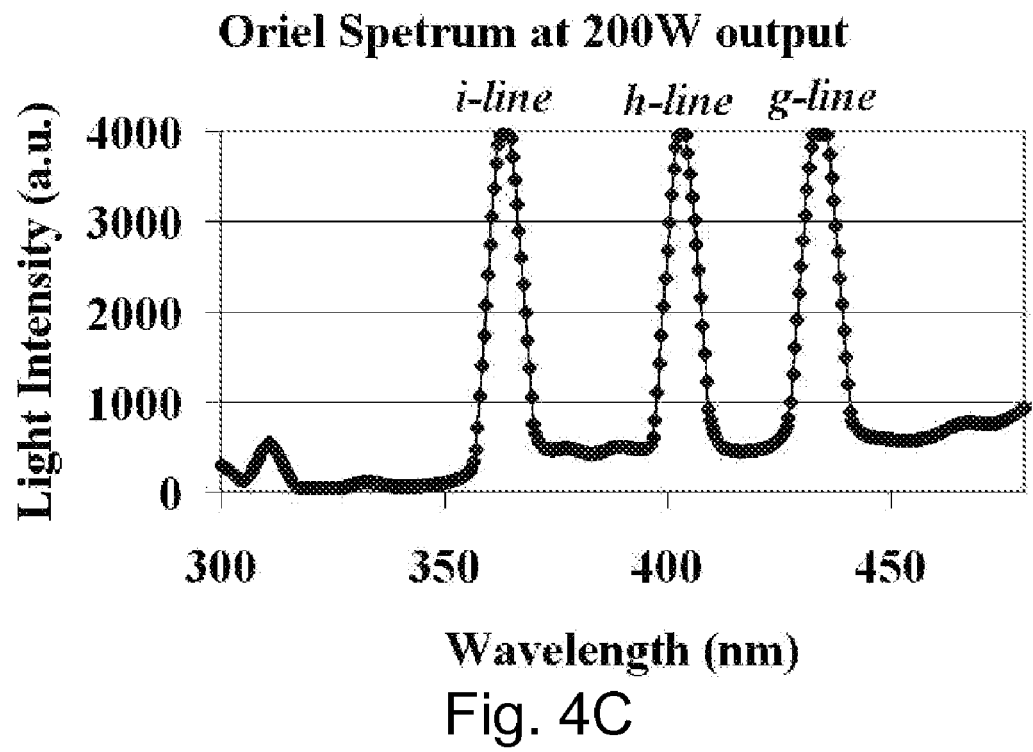
Figure 4D:
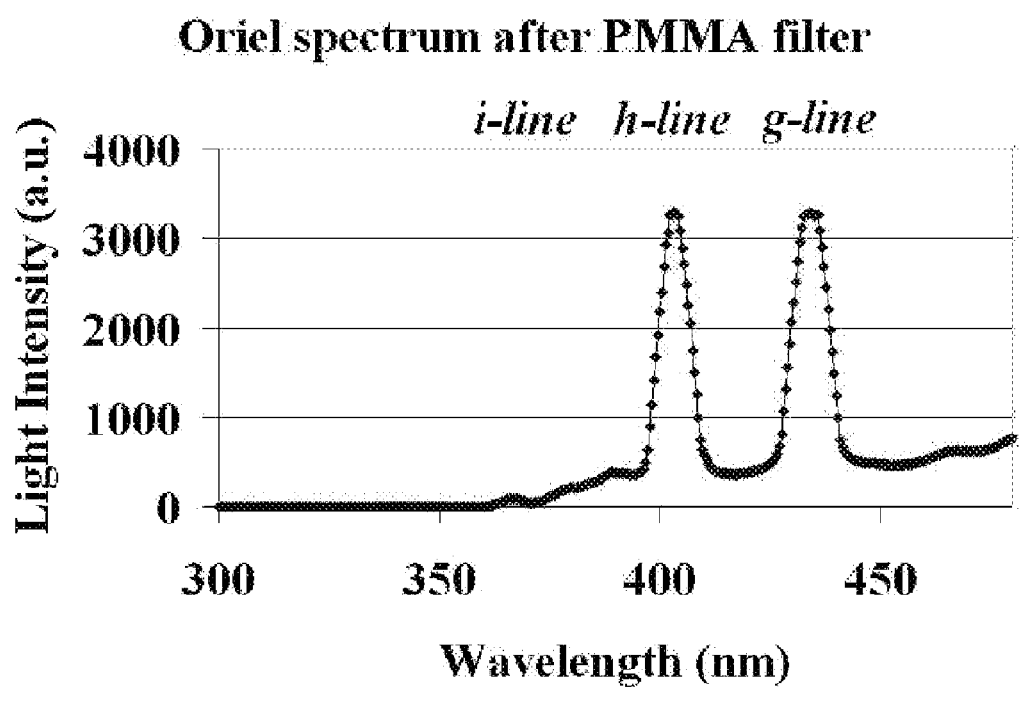
Figure 5A:
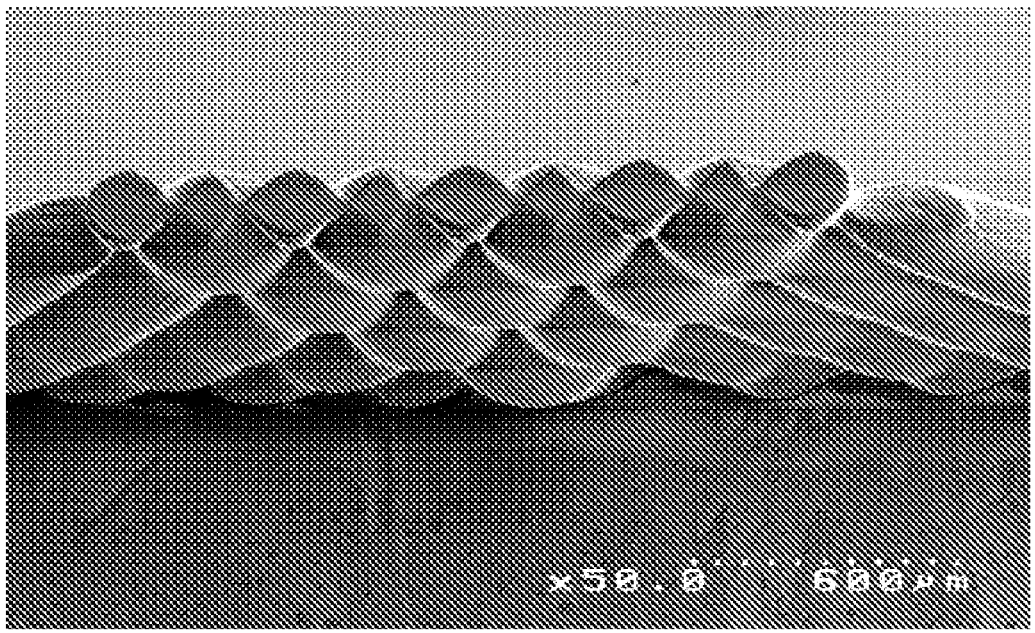
FIG. 5A is a scanning electron micrograph of one embodiment of an array of out-of-plane microlenses in an upright position.

To confirm that the PMMA filter was effective in inhibiting the occurrence of any over-exposure in the surface layer of the SU-8 photoresist, a 1100 μm thick layer of SU-8 100 was spin-coated onto a silicon support substrate at a speed of 400 rpm for approximately 25 sec, and then placed on a hot-plate and baked at 110° C. for 10 hr. Afterwards, the photoresist was tilt-exposed using UV-light (320-450 nm, Model # 85110; Oriel Corporation, Stratford, Conn.) filtered by a 4.538 mm thick polymethyl methacrylate PMMA sheet. Light transmission of the PMMA sheet, as shown in FIG. 4B, was approximately 0.3 percent at the i-line, 82 percent at the h-line, and 82 percent at the g-line. Light intensities at locations before and after the PMMA filter and the transmission of the PMMA filter, as shown in FIGS. 4C and 4D, respectively, indicated that the h-line was the primary source of lithography light because the absorbance at the h-line was about three times that of the g-line. The exposure dosage used in the lithography process was carefully controlled to improve the surface profile and uniformity of each pixel. After post-baking and developing the exposed SU-8 100 photoresist, as more fully explained in Example 5, the double-exposed regions of photoresist formed pixels of an array of out-of-plane, pre-aligned, (at a desired position) refractive polymer microlenses as shown in FIG. 5A.

Figure 6:
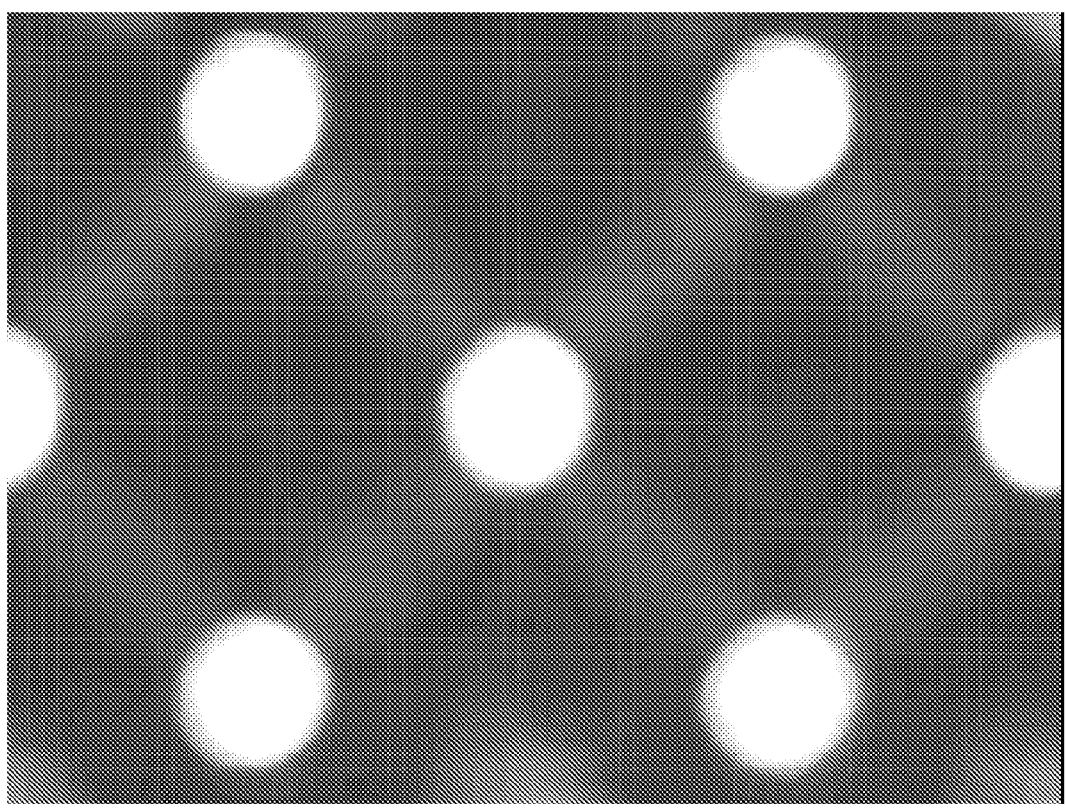
FIG. 6 shows the focal pads of one embodiment of an array of out-of-plane microlenses.

FIG. 6 shows the focal pads of the pixels in one embodiment of an array of microlenses. The back focal length, depth of focus, and diameter of the focal pads of the microlenses were measured to determine the size of the pixels for each microlens by projecting a collimated light source onto the backside of the microlenses. See Table 1. A high-resolution microscope such as a Nikon MM-22U Measuroscope (Nikon, Tokyo, Japan) and a CCD camera were used to observe and take images of the microlenses. As shown in FIG. 6, the focal pads of each microlens were uniform.

TABLE 1

| Lithography beam diameter | Size of each pixel (square size) | Measured focal length (f) | Measured focal pad (d) | Measured depth of Focus (DOF) |
| --- | --- | --- | --- | --- |
| 150 μm | 150 μm by 150 μm | 110.3 μm | 32.1 μm | 46.2 μm |
| 200 μm | 200 μm by 200 μm | 191.0 μm | 35.9 μm | 55.1 μm |
| 250 μm | 250 μm by 250 μm | 249.0 μm | 62.5 μm | 54.7 μm |
| 300 μm | 300 μm by 300 μm | 276.4 μm | 74.0 μm | 47.2 μm |
| 350 μm | 350 μm by 350 μm | 388.0 μm | 107.7 μm | 41.7 μm |

Figure 5B:
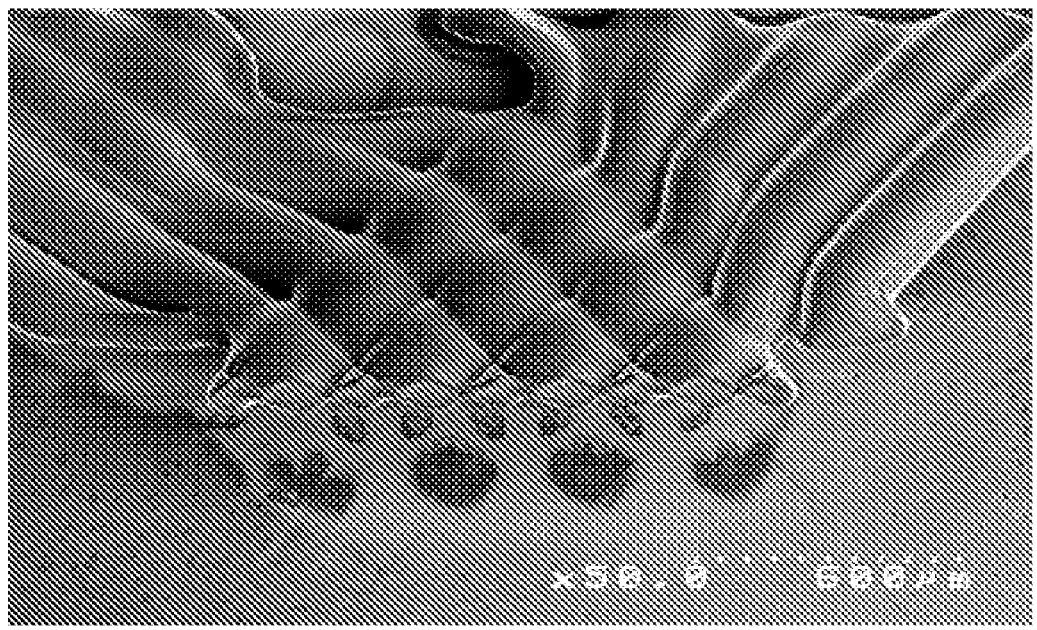
FIG. 5B is a scanning electron micrograph of one embodiment of an array of out-of-plane microlenses, which has been mechanically cut from the junction between one embodiment of an array of microlenses and a support substrate, and placed on the support substrate to measure the surface profile of the microlenses.

The fill-factor of an array of microlenses is defined as the percentage of the lens area to the total area, which is affected by the pixel geometry and lens layout. The maximum fill-factor for a round microlens pixel is about $\pi/4$ in an orthogonal-configured lens array and about $\sqrt{3}\pi/6$ in a hexagonal-configured lens array. These array configurations both have a smaller fill-factor than that of an array of out-of-plane microlenses with square-shaped pixels. The geometric shape of each pixel in the SU-8 microlens array is equivalent to cutting a quasi spherical-shaped, surface-cut microlens fitted into a square frame, as shown in FIG. 5B, which allows for a fill-factor of almost 100 percent, and enhances energy transmission efficiency.

EXAMPLE 4

Performance of a Numerical Simulation to Further Understand the Process Involved in Fabricating Quasi Spherical-Shaped Ball/Spherical Lenses To better understand the fabrication process and the affects of different exposure dosages and development times on the surface profiles of the microlenses, a numerical simulation was conducted. During the development process, as explained in Example 5, single-exposed surfaces of the SU-8 100 photoresist are dissolved at a faster rate than the double exposed regions with a majority of the double-exposed regions remaining after completion of the development process. Because half UV-light dosages were used in the lithograph process, only the SU-8 regions exposed to intersected beams of UV-light were double-exposed (i.e., two half dosages of UV-light, which form a full dosage sufficient to fully cure the SU-8.) See FIG. 15A.

The half-exposed regions of the SU-8 photoresist dissolved at a higher rate than the fully-exposed regions, and thus for purposes of numerical simulation, it was assumed that the development of the unexposed SU-8 regions did not affect the development of the exposed SU-8 regions. The development rate of the SU-8 in the double-exposed region of the microlens was determined to be approximately 50-80 percent (0.5-0.8 times) of that for the single exposed region, based on the dosage used. For the regions near the intersection of the UV-light beams, the single-exposed layers covered the double-exposed region. During the fabrication process, shortly after the single-exposed region was developed, the development solution began to attack the double-exposed region. After a given development time, the final surface profile obtained was based on the combined affects of development of both the single-exposed and double-exposed regions at different rates and thicknesses.

Figure 7A:
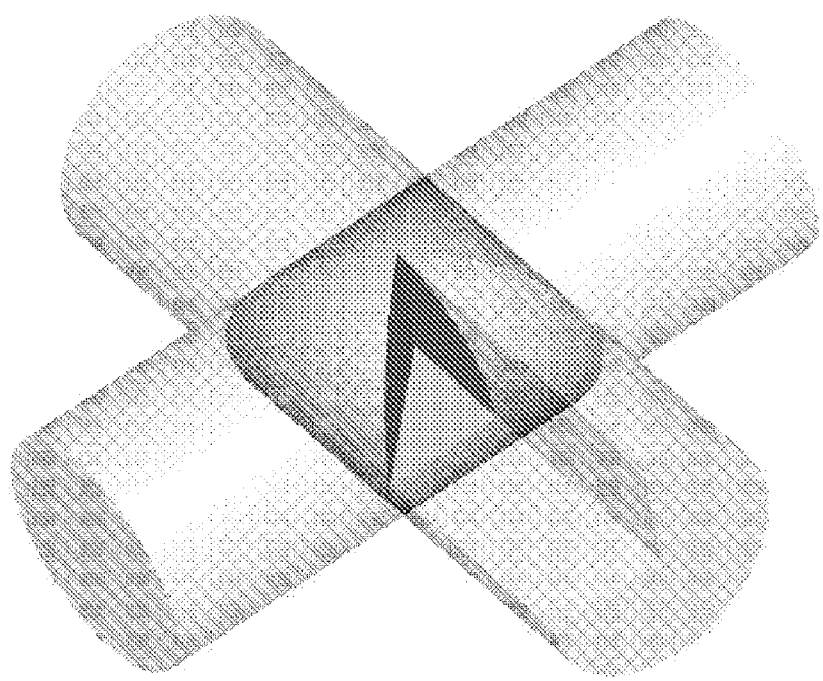
FIG. 7A is a schematic diagram of two perpendicular-intersected beams that form the exposed region of one embodiment of the microlens.
Figure 7B:
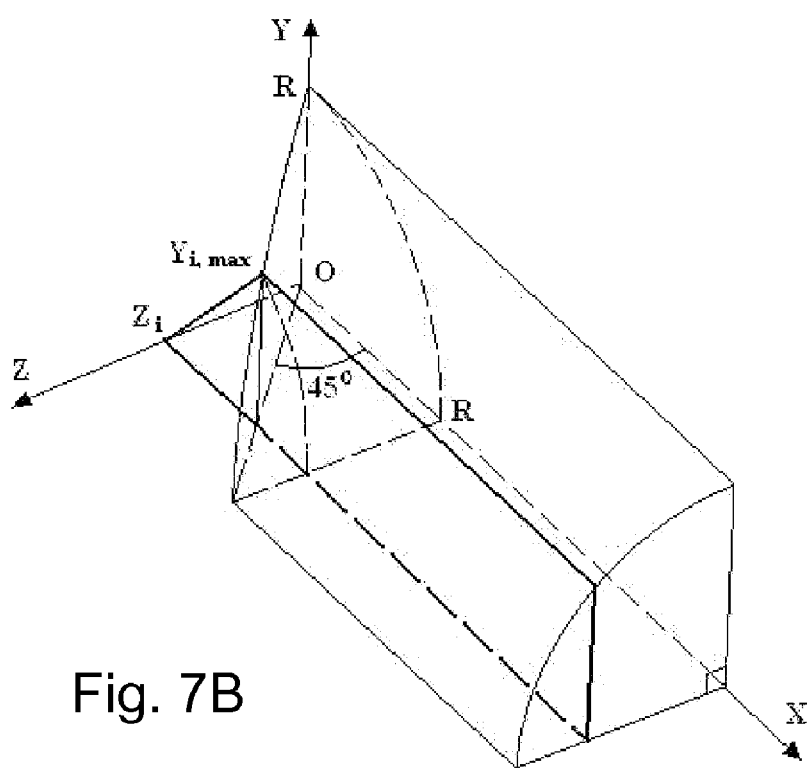
FIG. 7B is a schematic diagram showing a Cartesian coordinate system plotting a portion of the exposed region in FIG. 7A.
Figure 8:
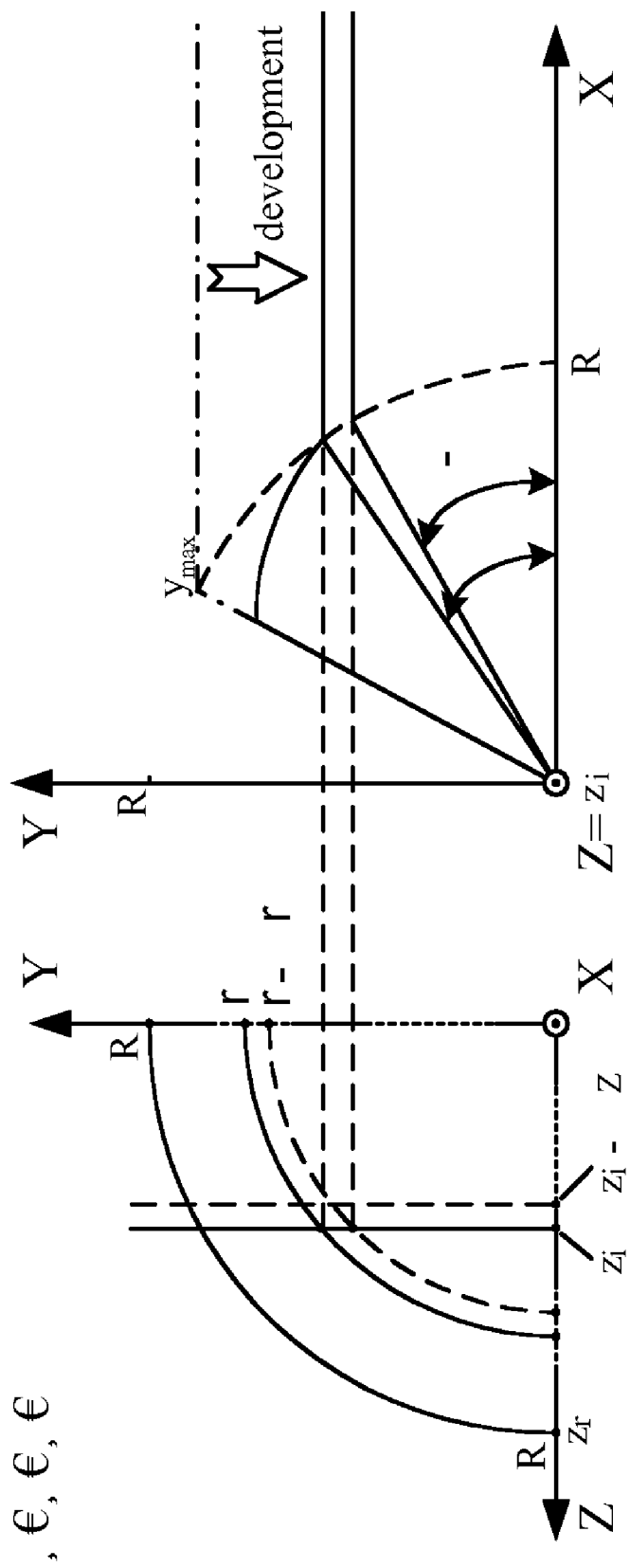
FIG. 8 is a graph plotting the development affects on the surface of one embodiment of the out-of-plane microlens.

Because of the geometric symmetry of the intersected regions shown in FIG. 7A only one sixteenth of the intersected regions of UV-light required numerical simulation. See FIG. 7B. To perform a numerical simulation, a Cartesian coordinate system having an origin located at the cross-point of the two axes of UV-light beams was assigned, as shown in FIG. 8 (right side of the figure). A schematic diagram of the projected view of the intersected region along the positive x-axis of FIG. 7B is shown in FIG. 8 (left side of the figure). A side view of the intersected region along the z-axis direction is also shown in FIG. 8 (right side of the figure).

The following major assumptions were made for numerical simulation: developing rates of both the single and double-exposed SU-8 photoresists do not change during the development process; and both the single and double-exposed SU-8 surfaces will be developed uniformly along the radial direction of the exposed cylindrical surfaces. As shown in FIG. 7A, the double-exposed region was covered by the single-exposed photoresist layer. The thickness of the unexposed SU-8 layer changed from zero at the vertex point of the lens to a maximum thickness of 0.414r at the edge, where r was the radius of the ball shape created at the edge of the intersection of the two cylinders. During development, the single-exposed layer in the intersected region has to develop before the double-exposed region. In the radial direction, the development rate was assumed to be constant as viewed from the z-axis shown in FIG. 7B. As the single-exposed region developed, more of the double-exposed region began to develop albeit at a lower rate, beginning at the vertex point. The final surface profile of the microlens was the combined results of the development of both the single and double-exposed photoresists at different rates.

FIG. 8 (right side of the figure) shows the projected view of UV-light during the development process as observed from the positive z-axis direction of FIG. 7B. FIG. 8 (left side of the figure) shows the projected view of the double-exposed region during the development process as observed from the positive x-axis direction as shown in FIG. 7B. The radius of the lithography beam, as shown in FIG. 8, was R.

Along the z-axis, R was numerically divided into a plurality sub-sections: $Z_r, Z_{r-1}, \ldots Z_i, \ldots Z_2, Z_1, Z_0$. Assuming that a vertical plane numerically divides the model at $z=z_i$, as the single-exposed SU-8 photoresist is dissolved from radius r to r-Δr the cross-section, as shown in FIG. 8 (left side of the figure), further divides into a series of sub-domains with y positions at $y_{i,r}, y_{i,r-1}, \ldots, y_{i,j}, \ldots, y_{i,2}, y_{i,1}, y_{i,0}$. As the angular position changes from θ to θ-Δθ, the vertical coordinate changes from $y_{i,j}$ to $y_{i,j-1}$. As shown in FIG. 8 (right side of the figure), as the double-exposed region is gradually exposed to the developing solution, these sub-domains dissolve along the radial direction of the dashed curve.

Figure 9:
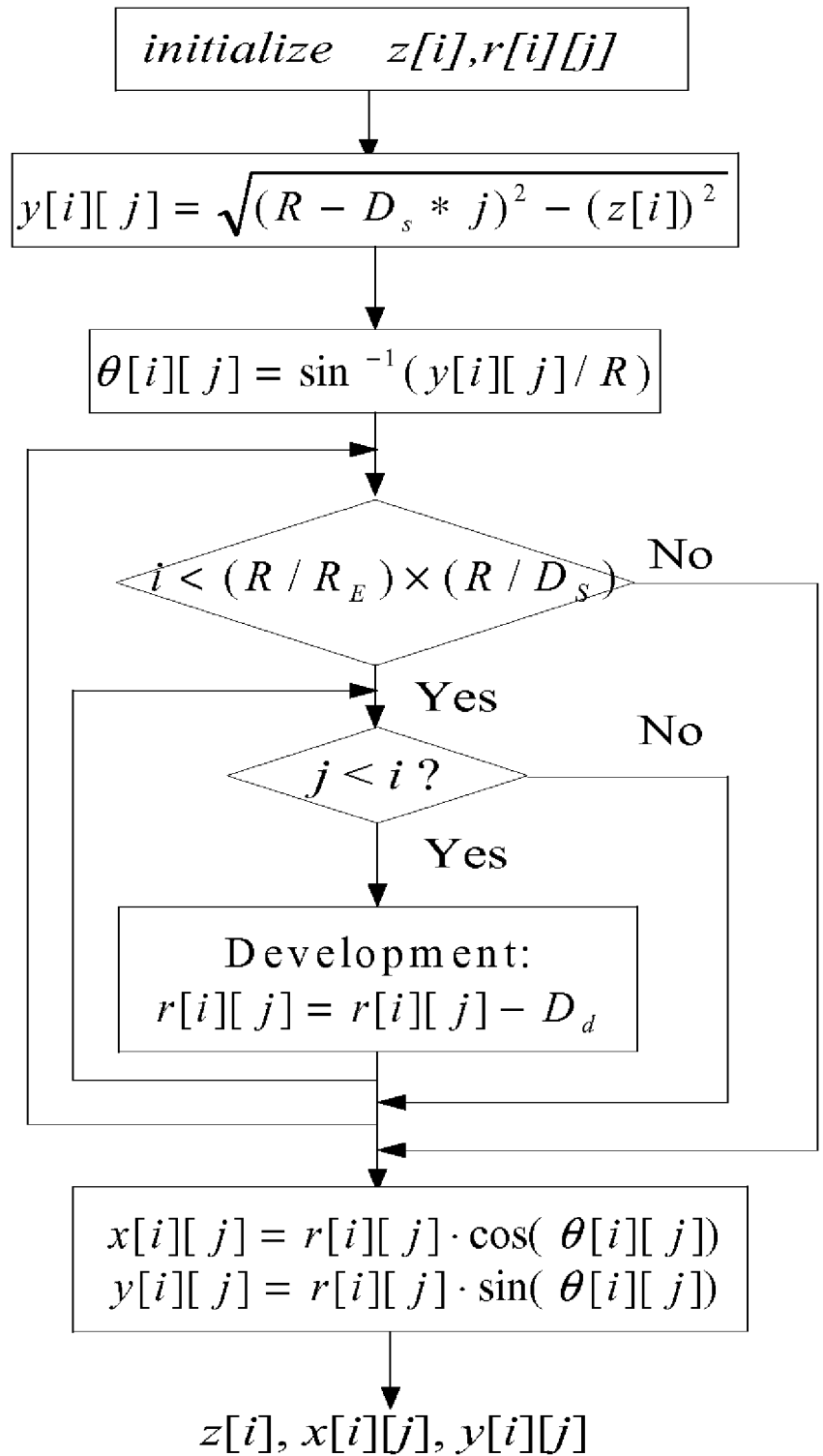
FIG. 9 is a flowchart of a numerical simulation algorithm for the development of SU-8 photoresist for fabricating one embodiment of the out-of-plane microlens.
Figure 10A:
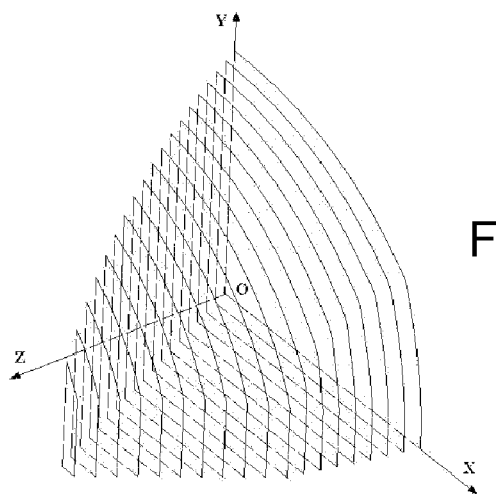
FIG. 10A is a graph plotting the simulated surface area of the double-exposed regions of one embodiment of the out-of-plane microlens.
Figure 10B:
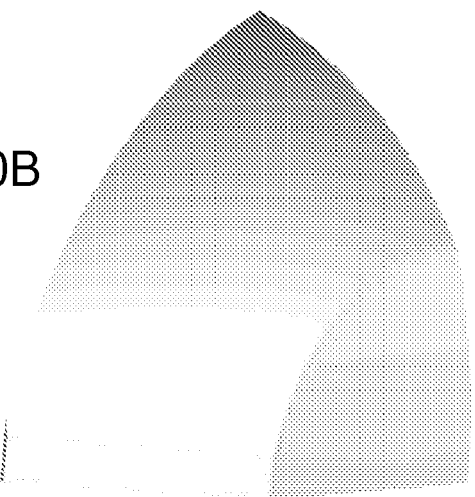
FIG. 10B is a schematic diagram of the blended surface of the double-exposed regions shown in FIG. 10A.
Figure 10C:
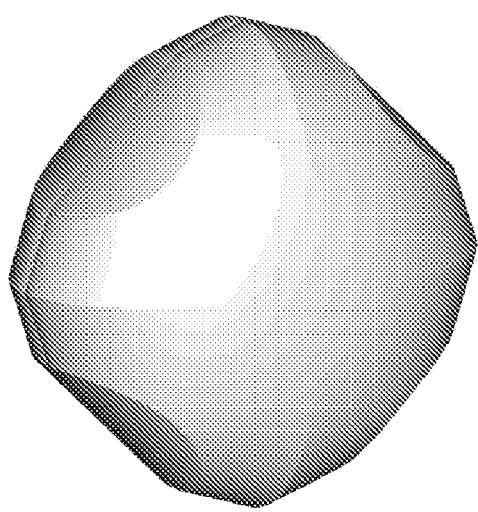
FIG. 10C is a schematic diagram of one embodiment of the out-of-plane microlens viewed from a random angle.

FIG. 9 is a flowchart of a numerical simulation algorithm of the development process of SU-8 photoresist in accordance with this invention. A program was developed to carry out the calculations outlined in the flowchart shown in FIG. 9. A grid of position points was calculated numerically by slicing the model in FIG. 7B in the z direction and along the angular direction. The data points obtained as the model was numerically sliced along the z-axis are shown graphically in FIG. 10A. After obtaining the coordinate positions for all of the interested points (z[i], x[i][j], y[i][j]), a commercial software (Pro/E; PTC, Inc., Needham, Mass.), was used to connect the coordinates to obtain the surface profile, as shown in FIG. 10B, for the simulated one sixteenth portion of the microlens. Finally, the simulated surface profile for the entire microlens was obtained using geometrical symmetry as shown in FIG. 10C. A value of 1:0.55 was used as a development rate ratio between the single exposed regions and the double exposed regions.

From the simulated results shown in FIGS. 10B and 10C, slight edge-lines between each of the sections of the microlens existed because a uniform development rate was assumed in the radial direction. However, dissolution of a solid surface is a process related to volume, and thus sharp corners are always dissolved faster than a planar surface. In the actual SU-8 development process, the SU-8 developer smoothens out the sharp edges along the 45-degree dividing lines between the x or z coordinates.

Figure 11:
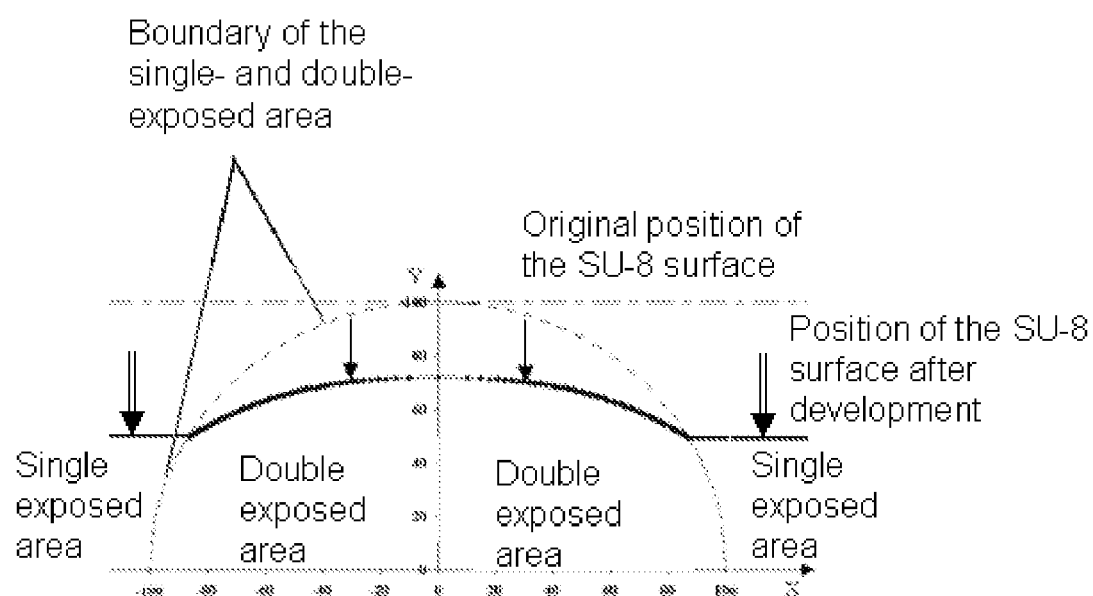
FIG. 11 is a graph plotting the simulated surface profile of a cross-sectional area of one embodiment of the out-of-plane microlens when Z=0 and the radius of the single-exposed cylinders forming the microlens are developed to 50 percent their original size.

FIG. 11 is a graph plotting the simulated surface profile of a cross-sectional area of the microlens, when Z=0 and the radius of the single-exposed cylinders are developed to 50 percent their original size. The equation for calculating the polynomial trend line for the dot line curve, as shown in FIG. 11 when Z=0 and $R^2=1$, is as follows:

$$y = -2 \times 10^{-11} x^6 + 4 \times 10^{-9} x^5 4 \times 10^{-7} x^4 + 2 \times 10^{-6} x^3 - 0.0016 x^2 + 0.0005 x + 71.95. \quad (5)$$

Neglecting the higher order terms, a parabolic curve is obtained as Eq. (6):

$$y = -0.0016 x^2 + 0.0005 x + 71.95, \quad (6)$$

where the constant term is the y-axis offset.

The diameter of the prototype microlens fabricated in this simulation ranged from about 100 μm to about 1000 μm. At this range, optical diffraction for a visible light source can be neglected. Optical-design software capable of simulating free-space optical systems such as ZEMAX® (ZEMAX Development Corporation, San Diego, Calif.) was used to simulate the wavelength in the visible light range of the visible light source.

Figure 12:
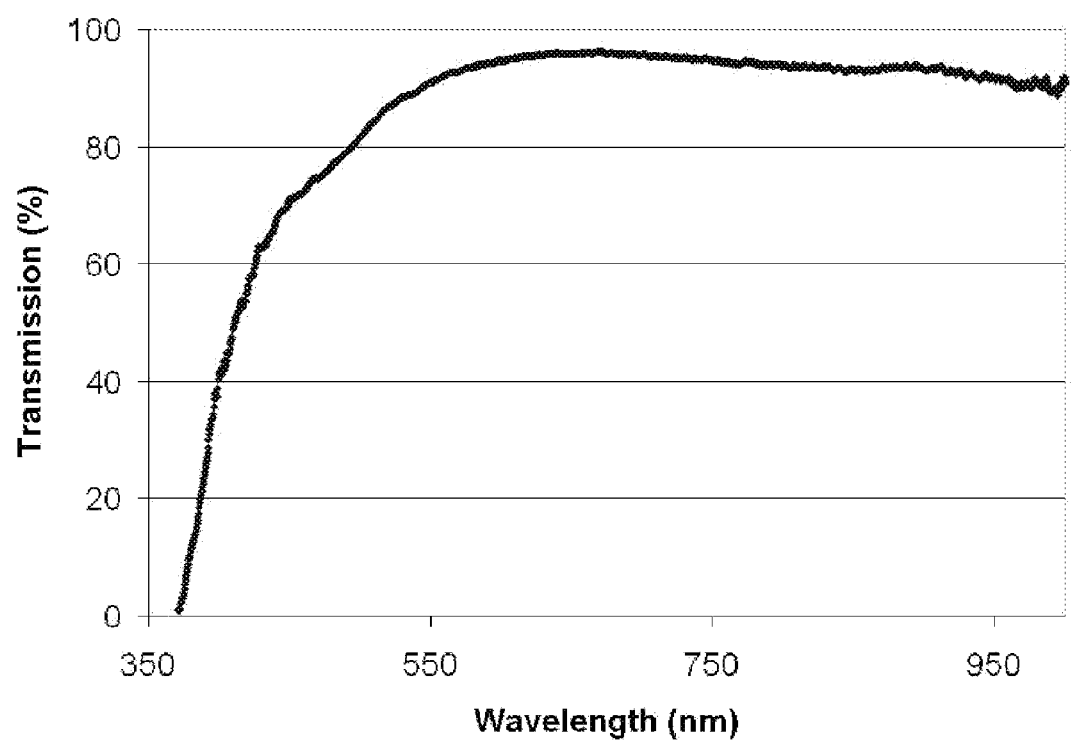
FIG. 12 is a graph plotting the transmission spectrum of a cured SU-8 film as a function of wavelength.
Figure 13:
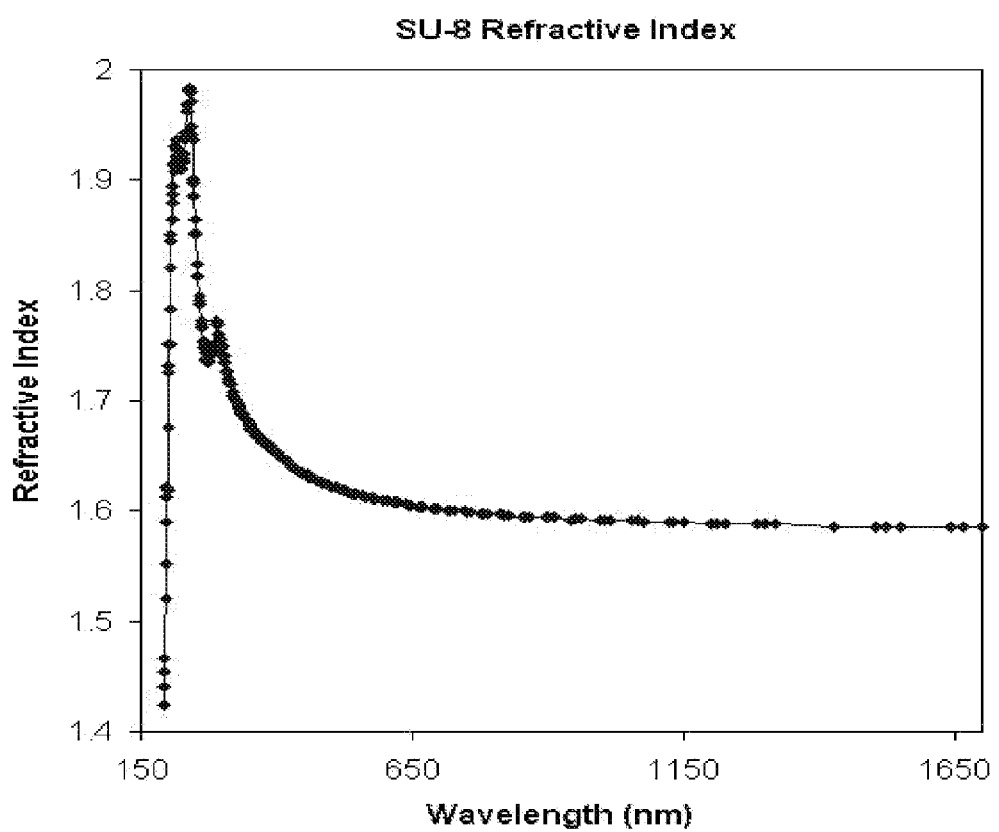
FIG. 13 is a graph plotting the refractive index of a cured SU-8 film as a function of wavelength.

FIG. 12 is a graph plotting the transmission spectrum of a cured SU-8 film as a function of wavelength. FIG. 13 is the refractive index of the cured SU-8 film as a function of wavelength. The measurement was made using a 1.108 mm thick sample of SU-8 film with an Ocean Optics' S2000 spectrometer (Ocean Optics, Dunedin, Fla.). From the experimental results shown in FIG. 12, it can be seen that the transmission coefficient of the cured SU-8 is high, within a broad range of wavelength. This range covers the whole spectrum from near UV to infrared.

The surface profile shown in FIG. 10C was used in the numerical simulation with the optical design software. The quasi-parabolic surface profile of the microlens was converted into a data file, and then imported into the optical design software program. The simulations were then conducted in the non-sequential model of the software program. Because cured SU-8 is not a standard optical material, and the optical properties were not provided by the developers of the optical design software program, a new glass catalog was defined specifically for cured SU-8 by entering the transmission data and the refractive index data as shown in FIGS. 12 and 13. A database with 100 points for transmission and refractive index values ranging from about 301.34 nm to about 670.27 nm were entered. Visible lights at lines F, d and C having wavelengths of 486.13 nm, 587.56 nm, 656.27 nm, respectively, were used in the simulation, with the primary wavelength being the d line.

Figure 14A:
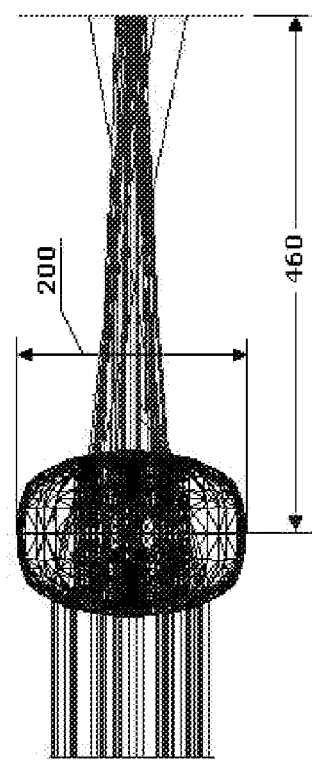
FIG. 14A is a schematic diagram of a shaded model of a light trace for the curved SU-8 structure shown in FIG. 15C.
Figure 14B:
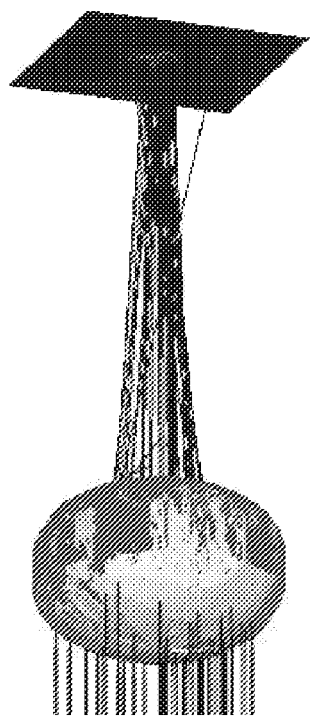
FIG. 14B is a schematic diagram of a NSC, three-dimensional layout of a light trace for the curved SU-8 structure shown in FIG. 15C.
Figure 14D:
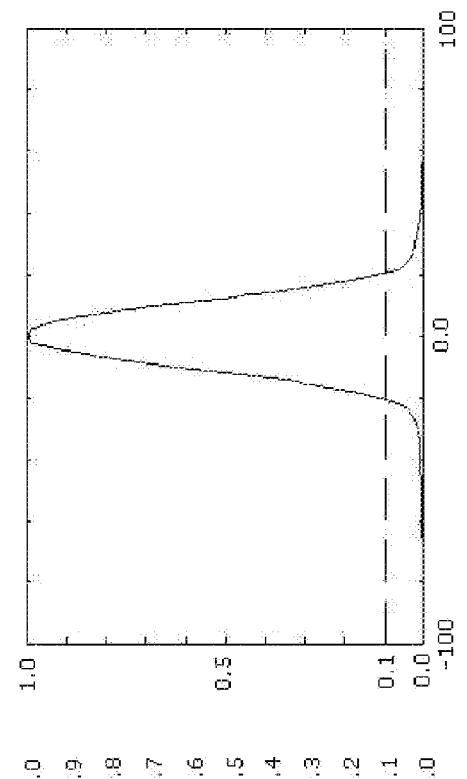
FIG. 14D is a graph plotting the cross-section of incoherent irradiance intensity distribution.
Figure 14C:
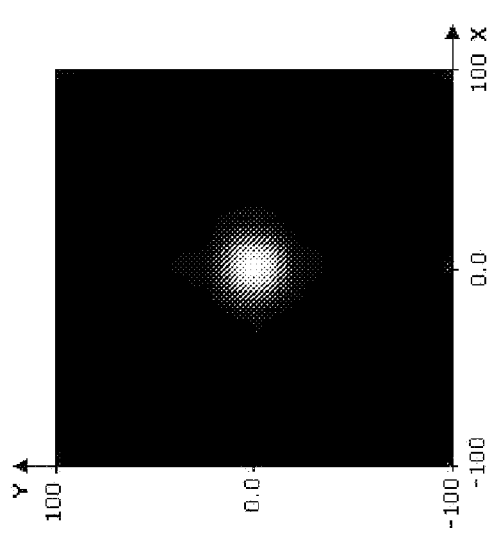
FIG. 14C is a top view and cross-section of incoherent irradiance for the light trace shown in FIGS. 14A and 14B in a focus position.

To obtain a general solution, dimensionless numbers were used in the simulation. The diameter of the lithography beam used to fabricate the microlens was assumed to be 200 units. FIGS. 14A and 14B shows the simulation results for the lens surface profile in FIG. 10C. A square collimated light source of 160 units by 160 units was projected onto the quasi-parabolic lens along the optical axis. The observation display screen used to view the projection had a dimension of 200 units by 200 units. By moving a virtual detector screen along the optical axis, the focus position was found to be 460 units away from the surface of the microlens as shown in FIG. 14B. By tracing the rays, the energy distribution at the focal position was depicted on the display screen as shown in FIG. 14C. With the focal pad defined as the area within which the light intensity falls to 10 percent of the maximum light intensity level, the diameter of the focal pad was calculated to be approximately 40 units (20 percent of the diameter of the lithography beam). See FIG. 14D.

EXAMPLE 5

Fabrication of Out-of-Plane, Pre-Aligned, Polymer Refractive Micro-Lenses

Figure 15A:
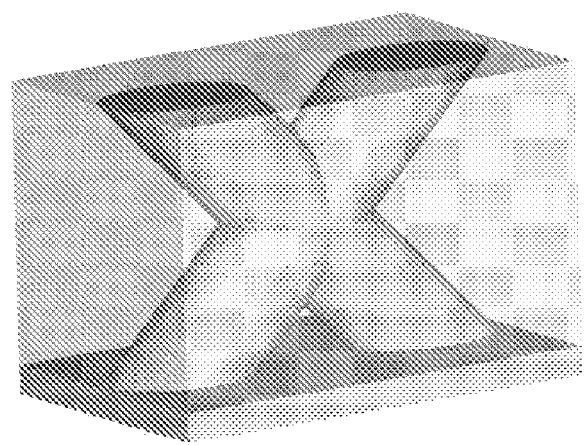
FIGS. 15A-15C show a schematic diagram of the fabrication process of one embodiment of an out-of-plane, pre-aligned, polymer refractive micro-lens created using UV lithography.
Figure 15B:
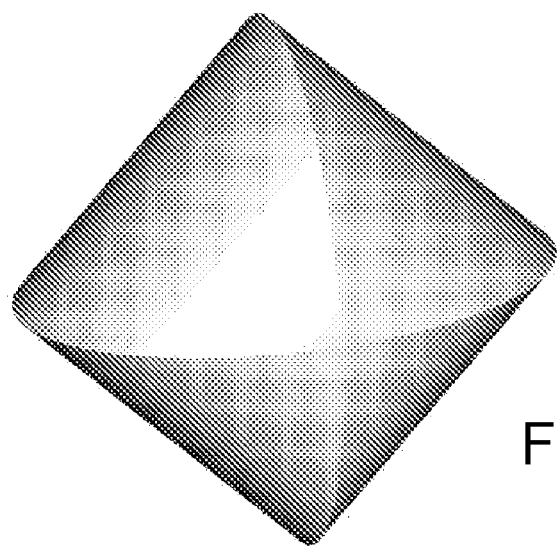
Figure 15C:
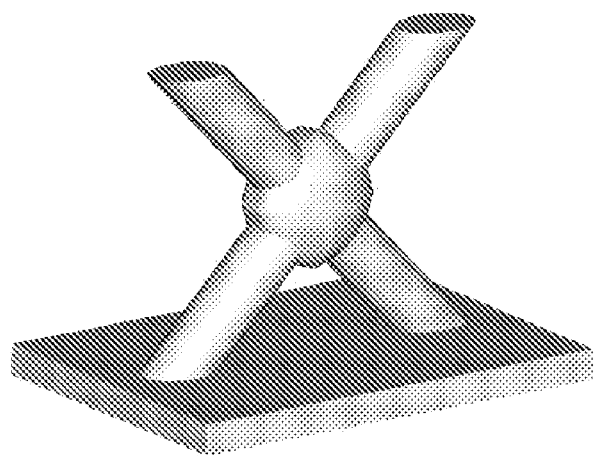
Figure 16A:
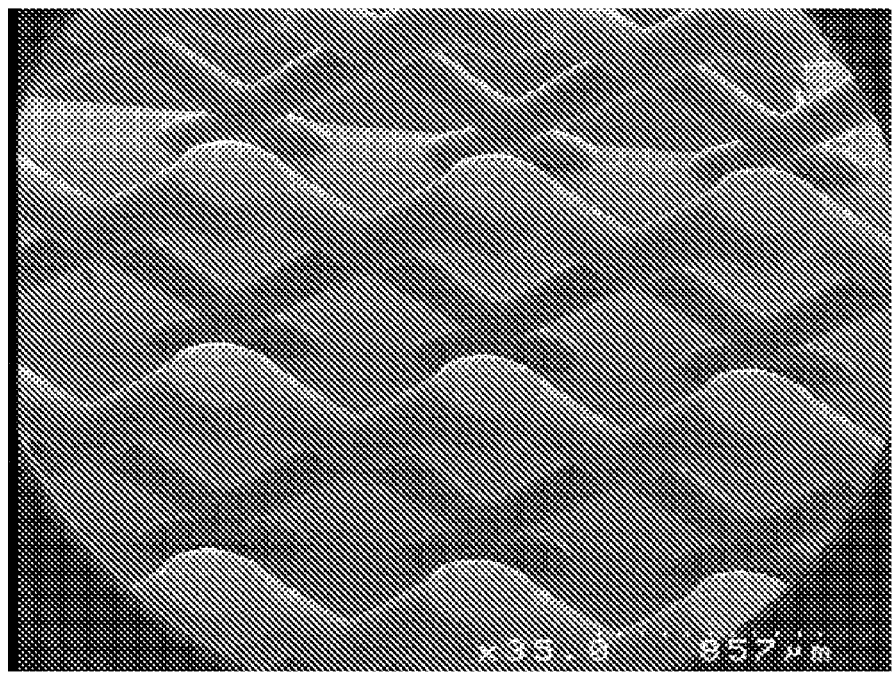
FIG. 16A is a scanning electron photomicrograph of one embodiment of an array of out-of-plane microlenses.

FIGS. 15A-15C show schematic diagrams of the fabrication process of one embodiment of an out-of-plane, pre-aligned, polymer refractive microlens created using UV lithography of SU-8 100. Other negative resist materials may be used to fabricate the micro-lenses such as SU-8 50, SU-8 75, and photosensitive hybrid sol-gel glass. First, a 450-500 μm thick silicon support substrate was cleaned with acetone, isopropyl alcohol and deionized water, and then dried in an oven at 120° C. (Other materials such as glass may be used to form a support substrate.) A layer of SU-8 100 photoresist having a thickness of approximately 1100 μm was spin-coated onto the support substrate at a speed of 400 rpm for approximately 25 sec, and then placed on a hot-plate and baked at 110° C. for 10 hr. The thickness of the SU-8 photoresist was determined by considering the size and desired height of the lens required to couple (i.e., to pass focused light from one optical fiber to another) and focus a targeted light beam. (In applications that require the coupling and focusing of multiple parallel light beams, an array of microlenses may be fabricated as shown in FIGS. 5A, 5B, and 16A.) The total thickness of the photoresist should be equal to the sum of the aperture diagonals of the lens, any additional height adjustments for coupling purposes, and the height required for focusing multiple light beams. After baking, the support substrate was allowed to cool to room temperature over a period of approximately 8-9 hr. Glycerin was applied to the central region of the support substrate, and then the mask was placed over the layer of SU-8 to minimize the potential for errors caused by diffraction between the mask and the SU-8 layer. (The mask and silicon substrate were held together using a specially-designed chuck that allowed the mask and substrate to be rotated to angles between (+) 45 degrees and (−) 45 degrees.

Figure 16B:
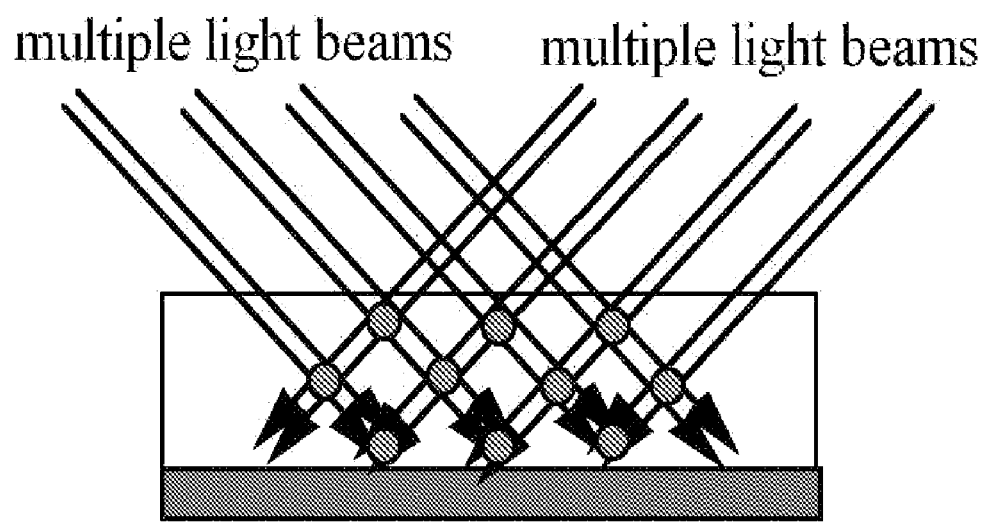
FIG. 16B is a schematic diagram of the angles of exposure of one embodiment of the microlens with UV lithography.

Using a tilted lithography process, as shown in FIG. 16B, the photoresist was exposed to multiple cylindrical UV-light beams having a wavelength of 320-450 nm (Oriel UV Station, Model # 85110; Oriel Corporation, Stratford, Conn.), as more fully explained in Example 3. UV-light beams from two directions were positioned perpendicular to one another to form double-exposed regions where the beams intersected, which are depicted as circles in FIG. 16B. In this embodiment, UV-light was passed through a 4.538 mm thick PMMA filter (as shown in FIG. 4D) before exposing the SU-8. See FIGS. 5A and 5B. According to the light spectrum, as shown in FIG. 4D, the exposure dosage measured at h-line was approximately 2.121 J/cm$^2$ for each light beam. The exposed sections of the SU-8 photoresist were solidified and formed two cylindrical sections having tilted supporting posts that intersected to form a microlens base as shown in FIGS. 15A. The central region of the microlens, as shown in FIG. 15B, represented the paraxial area for the lens, which was the working area for most of the optical functions performed by the lens.

In this embodiment, cylindrical light beams were obtained using a mask having elliptical-shaped openings as described in Example 1. A variety of lenses having different focal lengths may be created using UV-light beams with different diameters. Multiple exposure dosages of 200-400 mJ/cm$^2$ were used every 40-60 sec until a total exposure dosage of approximately 2.121 J/cm$^2$ was delivered, to avoid overexposure, diffusion, and scattering problems that often occur at the surface of a photoresist exposed with a single exposure dosage. The UV-light dosage required to pattern the microlens varied from about 1680 mJ/cm$^2$ for a 500 μm thick, soft-baked SU-8 to about 2880 mJ/cm$^2$ for a 1000 μm thick, soft-baked SU-8, at a wavelength of 405 nm. See FIG. 4D. To produce the quasi spherical-shaped lens, as schematically shown in FIG. 15A, the UV-light beams were projected onto the photoresist at an angle of approximately 45 degrees using a prism and glycerin to compensate for light refraction, based on the refraction index of SU-8: n=1.668 at λ=365 nm, and n=1.650 at λ=405 nm, as more fully explained in Example 2. See FIG. 16B.

Figure 17A:
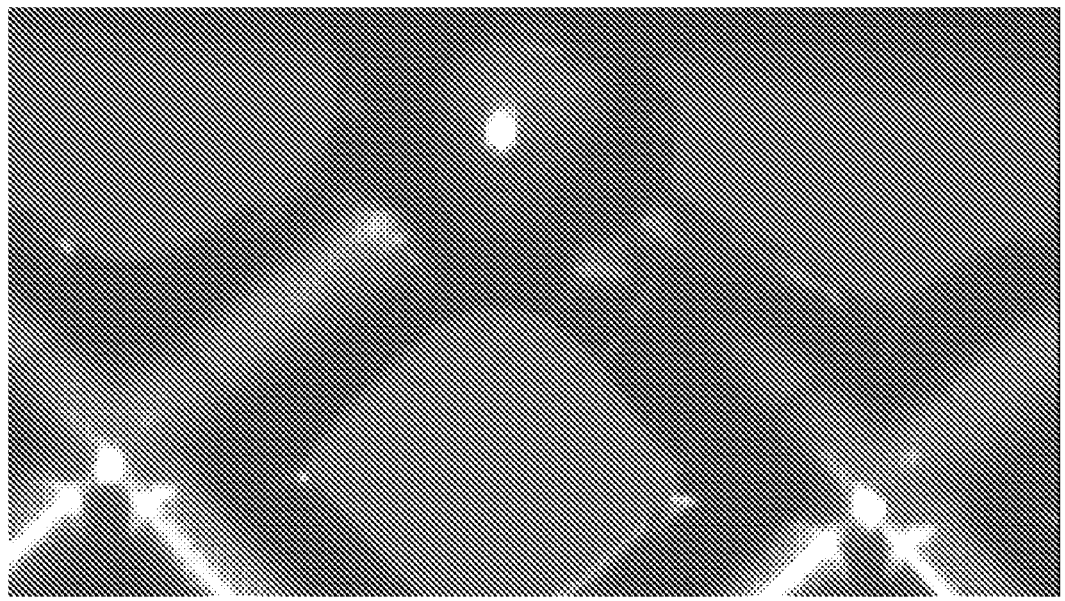
FIGS. 17A and 17B are scanning electron photomicrographs of one embodiment of an out-of-plane microlens.
Figure 17B:
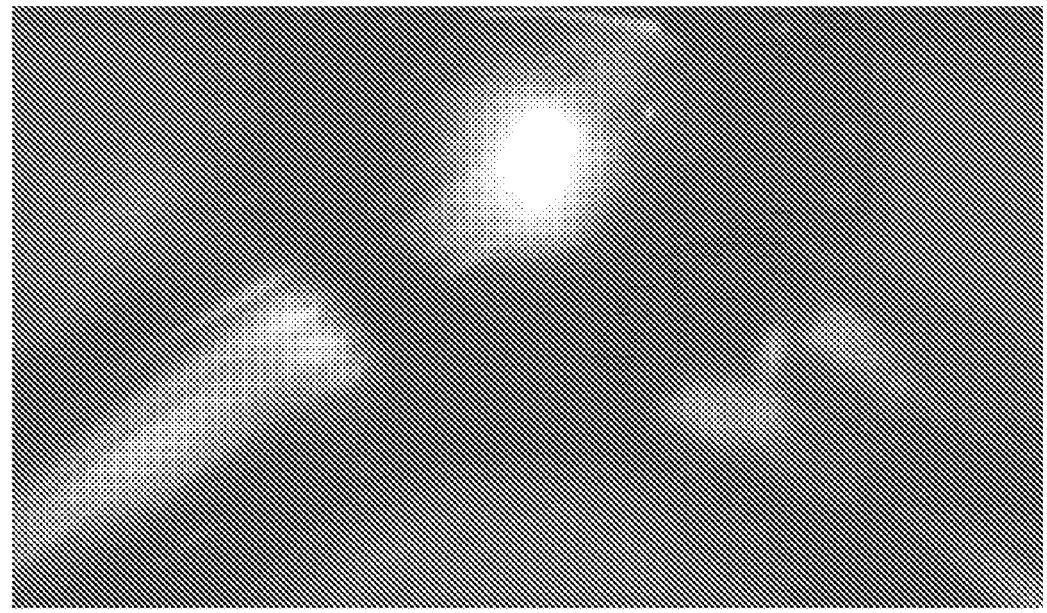

Once the tilted lithography procedure was completed, the mask was released from the photoresist by dipping the mask and the photoresist into deionized water. The exposed SU-8 photoresist was then placed on a hot-plate for post-baking at a temperature of 96° C. for 20 min, and allowed to cool to room temperature over a period of approximately 8-9 hr to release any residual stress in the photoresist. Afterwards, the photoresist was developed using an SU-8 developer solution, which removed unexposed regions of the photoresist, and etched away the sharp edges of the exposed regions of the photoresist to form a smoother, rounder surface for the microlens, as shown in FIG. 15B and more fully explained in Example 4. The SU-8 developer was a proprietary solution distributed by the MicroChem Corporation (MicroChem Corporation, Newton, Mass.). See FIGS. 15C, 17A, and 17B. See R. Yang et al., "Fabrication of Out-of-Plane SU-8 Refractive Microlens Based on Direct Lithography of SU-8," *Sensor and Actuators A*: Physical, Vol. 113, No. 1, pp. 71-77 (2004).

Once development of the photoresist was completed and the surface profile of the microlens reached design specifications, the photoresist was rinsed in isopropyl alcohol for 5 min, and then in deionized water for an additional 10 min, before drying the photoresist with nitrogen.

EXAMPLE 6

Figure 18A:
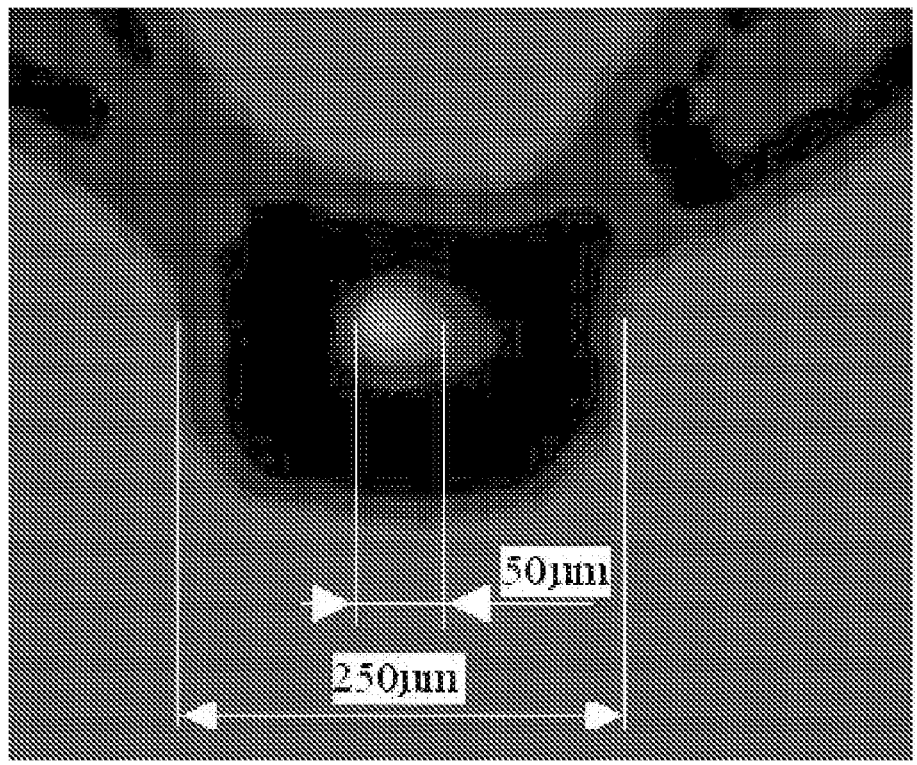
FIG. 18A is an optical photography of the focal pad for one embodiment of an out-of-plane microlens.
Figure 18B:
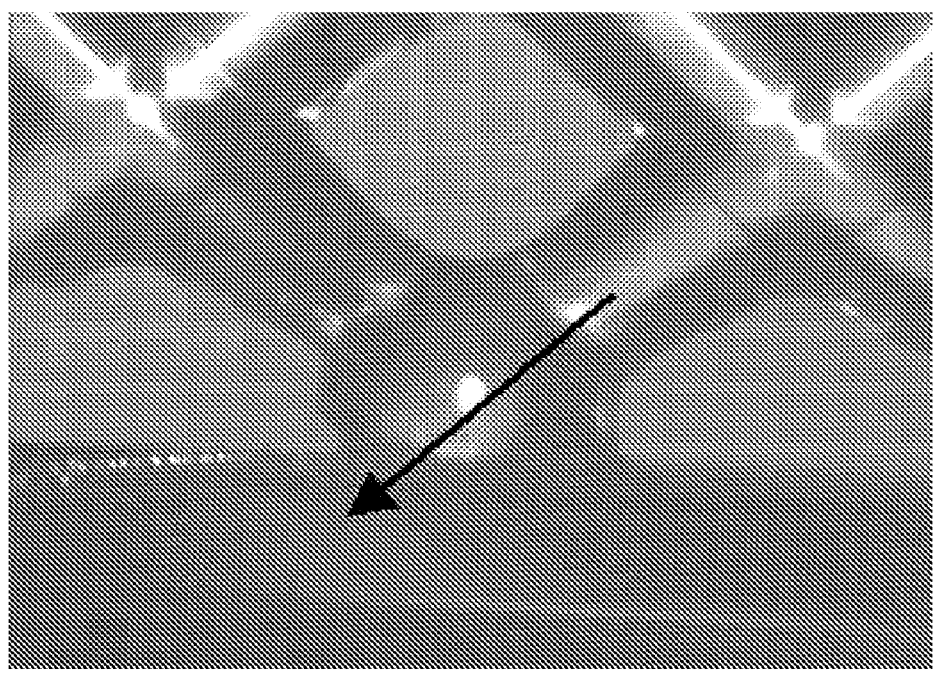
FIG. 18B is a scanning electron micrograph of one embodiment of an out-of-plane microlens.
Figure 19:
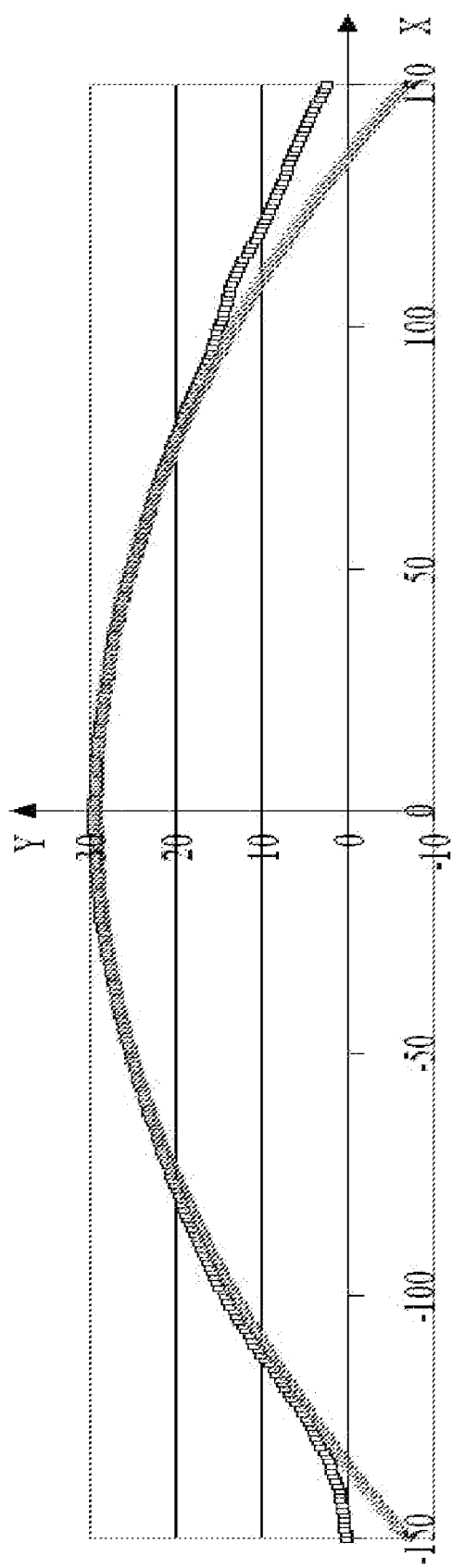
FIG. 19 is a graph plotting the surface profile of one embodiment of an out-of-plane microlens at Z=0, in which $Y_1$ stands for measured points and $Y_2$ stands for the simulated surface points of a surface profiler.

Comparison Tests Between One Embodiment of the Out-of-Plane Microlens Fabricated Using the UV Lithography Method and the Numerical Simulation Method FIGS. 18A and 18B depict images of one embodiment of microlens. A collimated light beam of a diameter of 250 mm was projected on the microlens, as shown in FIG. 18A, to measure the prototype microlens. The microlens had a backside focus length of 300-350 mm, a minimum focus pad of approximately 50 μm, and a depth-of-focus of approximately 10 μm, which were similar to the dimensions reached during the numerical simulation. Because of the dramatic variations of the surface profile over a small range, a Tencor Alpha-Step 500 surface profiler (KLA-Tencor Cooperation, San Jose, Calif.) was used to measure the surface profile of the prototype microlens. The prototype microlens shown in FIG. 18A was removed from the support substrate and scanned along the direction of the lithography beam as shown by the arrow line in FIG. 18B. The measurement and simulated results were plotted for comparison as shown in FIG. 19. Based on the measured data, the mathematical function for the central part of the surface profile of the microlens, as shown in FIG. 11, can be obtained using the numerical curve-fitting method expressed in Eq. (7) with R$^2$=0.9984. Neglecting high order terms, the following equation is obtained:

$$y=-0.0016x^2-0.0118x+29.165 \qquad (7)$$

Comparing Eq. (7) with Eq. (6), the coefficients of the second order terms were similar to each other, and thus the simulated surface curvature was similar to that of the surface curvature of the fabricated microlens.

The complete disclosures of all references cited in this specification are hereby incorporated by reference. Also incorporated by reference is the following publication of the inventors' own work: R. Yang et al., "Fabrication of Out-of-Plane SU-8 Refractive Microlens Using Directly Lithography Method," *Proceedings of SPIE—The International Society for Optical Engineering*, Vol. 5346, pp. 151-159 (2004); R. Yang et al., "Out-of-plane Polymer Refractive Microlens Fabricated Based on Direct Lithography of SU-8," *Sensor and Actuators A: Physical*, Vol. 113, No. 1, pp. 71-77 (2004); R. Yang et al., "Numerical and Experimental Study on an Out-of-Plane Pre-aligned Refractive Microlens Fabricated Using UV Lithography Method," *Optical Engineering*, Vol. 43, No. 12, pp. 3096-3103 (2004); R. Yang et al., "Microfabrication of an Integrated SU-8 Waveguide with an Imbedded Focusing Lens for Application in Single Molecule Detection (SMD)," *Proceedings of the SPIE International Symposium on MOEMS-MEMS Micro & Nanofabrication*, in Photonics West, Vol. 5718, pp. 54-59 (2005); R. Yang et al., "Fabrication of Out-of-Plane Concave and Convex Refractive Microlens Array," *Proceedings of the SPIE International Symposium on MOEMS-MEMS Micro &*

*Nanofabrication*," Vol. 5717, pp. 134-141 (2005); and R. Yang et al., "Out-of-plane Microlens Array Fabricated Using UV-lithography," to appear in *Applied Physics Letter in* 2005. In the event of an otherwise irreconcilable conflict, however, the present specification shall control.

We claim:

1. A method for fabricating out-of-plane microoptical devices, said method comprising the steps of:
    (a) coating a layer of a negative photoresist onto a planar support substrate;
    (b) selectively irradiating said photoresist through a mask with two or more intersecting radiation beams impinging at different angles to create one or more latent first microoptical structures in the photoresist layer, wherein at least some of the first microoptical structures have optical axes that lie in a plane parallel to the plane of the substrate;
    (c) selectively irradiating the photoresist with two or more intersecting beams of radiation impinging at different angles to create one or more latent second microoptical structures, wherein the second microoptical structures comprise one or more fully-exposed regions in areas exposed by two or more beams and one or more partially-exposed regions in areas exposed by only one beam, and one or more unexposed regions in areas exposed by no radiation, wherein at least some of the second microoptical structures have optical axes that lie in the same plane as the plane of the optical axes of the first microoptical structures, and wherein at least some of the first and second microoptical structures have the same optical axis;
    (d) curing the latent first and second structures in the photoresist; and
    (e) developing the photoresist, so that unexposed regions of the photoresist are completely removed, so that fully-exposed regions of the photoresist remain, and so that partially-exposed regions of the photoresist are partly removed, wherein the resulting surface at junctures between two partially-exposed regions and at junctures between partially-exposed regions and fully-exposed regions is smoother than it would have been had the partially-exposed regions of the photoresist completely remained.

2. A method as recited in claim 1, wherein the photoresist comprises SU-8.

3. A method as recited in claim 1, wherein the radiation is selected from the group consisting of ultraviolet light, x-ray, and electron-beams.

4. A method as recited in claim 1, wherein the radiation comprises ultraviolet light.

5. A method as recited in claim 1, wherein the two or more intersecting radiation beams intersect at 90° angles.

6. A method as recited in claim 1, wherein the second structures are exposed by irradiation through a mask comprising two or more openings in the shape of a conic section.

7. A method as recited in claim 6, wherein the mask comprises two or more openings having an elliptical shape.

8. A method as recited in claim 1, wherein the cured and developed photoresist is optically transparent, and wherein the first and second structures produced by said method are shaped to act as paired couplers and optical lenses for focusing one or more beams of light, wherein each paired coupler and optical lens has a common optical axis that is parallel to the plane of the substrate.

9. A method as recited in claim 8, wherein the structures are integrated with other optical components selected from the group consisting of mirrors, splitters, cylindrical lenses, and plano-plates.

* * * * *